(12) United States Patent
Paul et al.

(10) Patent No.: US 10,707,218 B2
(45) Date of Patent: Jul. 7, 2020

(54) TWO PORT SRAM CELL USING COMPLEMENTARY NANO-SHEET/WIRE TRANSISTOR DEVICES

(71) Applicant: GLOBALFOUNDRIES Inc., Grand Cayman (KY)

(72) Inventors: Bipul C. Paul, Mechanicville, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 70 days.

(21) Appl. No.: 16/045,920

(22) Filed: Jul. 26, 2018

(65) Prior Publication Data

US 2020/0035686 A1   Jan. 30, 2020

(51) Int. Cl.
*H01L 27/11* (2006.01)
*H01L 27/12* (2006.01)
*G11C 11/412* (2006.01)
*H01L 29/06* (2006.01)

(52) U.S. Cl.
CPC ........ *H01L 27/1104* (2013.01); *G11C 11/412* (2013.01); *H01L 27/1203* (2013.01); *H01L 29/0669* (2013.01)

(58) Field of Classification Search
CPC .. H01L 27/1104; H01L 27/11; H01L 29/0669; H01L 29/0665
See application file for complete search history.

(56) References Cited

U.S. PATENT DOCUMENTS

| | | | |
|---|---|---|---|
| 8,154,086 B2 | 4/2012 | Masuoka et al. | |
| 8,754,481 B2 | 6/2014 | Masuoka et al. | |
| 9,721,957 B2 | 8/2017 | Nakanishi et al. | |
| 2005/0179061 A1* | 8/2005 | Jang | H01L 27/0688 257/208 |
| 2012/0181622 A1 | 7/2012 | Masuoka et al. | |
| 2014/0312426 A1 | 10/2014 | Balakrishnan et al. | |
| 2015/0113492 A1 | 4/2015 | Lin et al. | |
| 2015/0179655 A1 | 6/2015 | Nakanishi et al. | |
| 2015/0318288 A1 | 11/2015 | Lim et al. | |
| 2016/0078922 A1 | 3/2016 | Liaw | |
| 2016/0133633 A1 | 5/2016 | Liaw | |

(Continued)

OTHER PUBLICATIONS

U.S. Appl. No. 15/866,855, filed Jan. 10, 2018.

*Primary Examiner* — Michele Fan
(74) *Attorney, Agent, or Firm* — Amerson Law Firm, PLLC

(57) ABSTRACT

One illustrative device disclosed herein includes a first pull-up transistor positioned in a first P-type nano-sheet and a first pull-down transistor and a first pass gate transistor positioned in a first N-type nano-sheet. The device further includes a second pull-up transistor positioned in a second P-type nano-sheet and a second pull-down transistor and a second pass gate transistor positioned in a second N-type nano-sheet. The device further includes a read pull-down transistor and a read pass gate transistor positioned in a third N-type nano-sheet. The device also includes a first shared gate structure positioned adjacent the first pull-up transistor and the first pull-down transistor and a second shared gate structure positioned adjacent the second pull-up transistor, the second pull-down transistor and the read pull-down transistor.

20 Claims, 20 Drawing Sheets

(56) References Cited

U.S. PATENT DOCUMENTS

| | | |
|---|---|---|
| 2016/0240541 A1 | 8/2016 | Liaw |
| 2016/0284712 A1 | 9/2016 | Liaw |
| 2016/0336329 A1* | 11/2016 | Colinge .............. H01L 27/1104 |
| 2017/0125424 A1 | 5/2017 | Pao et al. |
| 2017/0179135 A1 | 6/2017 | Pao et al. |
| 2017/0200491 A1 | 7/2017 | Liaw |
| 2018/0174642 A1* | 6/2018 | Huynh Bao ........ H01L 27/0688 |

* cited by examiner

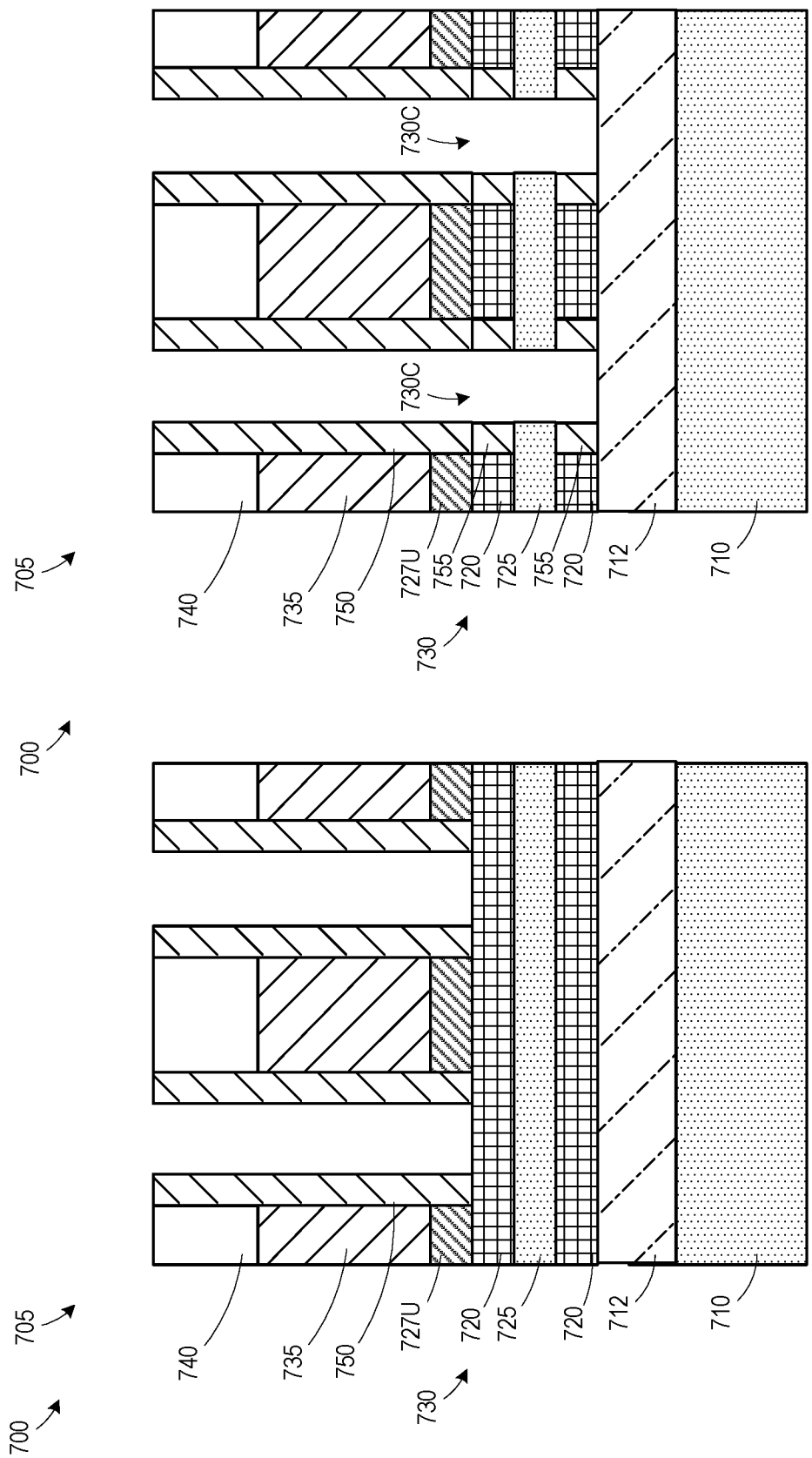

US 10,707,218 B2

TWO PORT SRAM CELL USING COMPLEMENTARY NANO-SHEET/WIRE TRANSISTOR DEVICES

BACKGROUND

1. Field of the Disclosure

Generally, the present disclosure relates to the manufacture of semiconductor devices, and, more specifically, to various novel methods of forming a two port SRAM cell using complementary nano-sheet/wire transistor devices and the resulting structures.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain (S/D) regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises S/D regions and a gate electrode structure positioned above and between the S/D regions. Upon application of an appropriate control voltage to the gate electrode, a conductive channel region forms between the S/D regions. A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure.

CMOS devices generally require both NMOS and PMOS devices. These devices are typically arranged in a pattern that allows the devices to be interconnected to create functional units. For example, a two port static random access memory (SRAM) cell typically includes two PMOS devices and six NMOS devices with different interconnects between the gates and S/D regions to create the memory cell. The various devices consume area in the circuit layout, resulting in a minimum cell area. Generally, reducing the cell area requires an advancement in the process used that allows smaller devices to be fabricated. It would be useful to reduce cell area without requiring a fundamental change in the fabrication processes.

SUMMARY

The present disclosure is directed to various novel methods of forming complementary nano-sheet/wire transistor devices and the resulting structures that may solve or reduce one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to forming a two port SRAM cell using complementary nano-sheet/nano-wire devices and the resulting devices. One illustrative device disclosed herein includes, among other things, a first stacked nano-sheet device having a first stack including a first P-type nano-sheet and a first N-type nano-sheet, a first pull-up transistor positioned in the first P-type nano-sheet and a first pull-down transistor and a first pass gate transistor positioned in the first N-type nano-sheet. The device further includes a second stacked nano-sheet device having a second stack including a second P-type nano-sheet and a second N-type nano-sheet, a second pull-up transistor positioned in the second P-type nano-sheet and a second pull-down transistor and a second pass gate transistor positioned in the second N-type nano-sheet. The device further inlcudes a third stacked nano-sheet device having a third stack including at least a third N-type nano-sheet, a read pull-down transistor and a read pass gate transistor positioned in the third N-type nano-sheet. The device also includes a first shared gate structure positioned adjacent the first pull-up transistor and the first pull-down transistor and a second shared gate structure positioned adjacent the second pull-up transistor, the second pull-down transistor and the read pull-down transistor.

One illustrative method disclosed herein includes, among other things, forming a first stacked nano-sheet device having a first stack including a first P-type nano-sheet and a first N-type nano-sheet, forming a first pull-up transistor in the first P-type nano-sheet, and forming a first pull-down transistor and a first pass gate transistor in the first N-type nano-sheet. The method further includes forming a second stacked nano-sheet device having a second stack including a second P-type nano-sheet and a second N-type nano-sheet, forming a second pull-up transistor in the second P-type nano-sheet, and forming a second pull-down transistor and a second pass gate transistor in the second N-type nano-sheet. The method also includes forming a third stacked nano-sheet device having a third stack including at least a third N-type nano-sheet and forming a read pull-down transistor and a read pass gate transistor in the third N-type nano-sheet. The method also includes forming a first shared gate structure adjacent the first pull-up transistor and the first pull-down transistor and forming a second shared gate structure adjacent the second pull-up transistor, the second pull-down transistor, and the read pull-down transistor.

BRIEF DESCRIPTION OF THE DRAWINGS

The disclosure may be understood by reference to the following description taken in conjunction with the accompanying drawings, in which like reference numerals identify like elements, and in which:

FIGS. 7A-7I illustrate a method for selectively removing a top nano-sheet in the stacked CFET and NFET nano-sheet devices.

Figure 1:
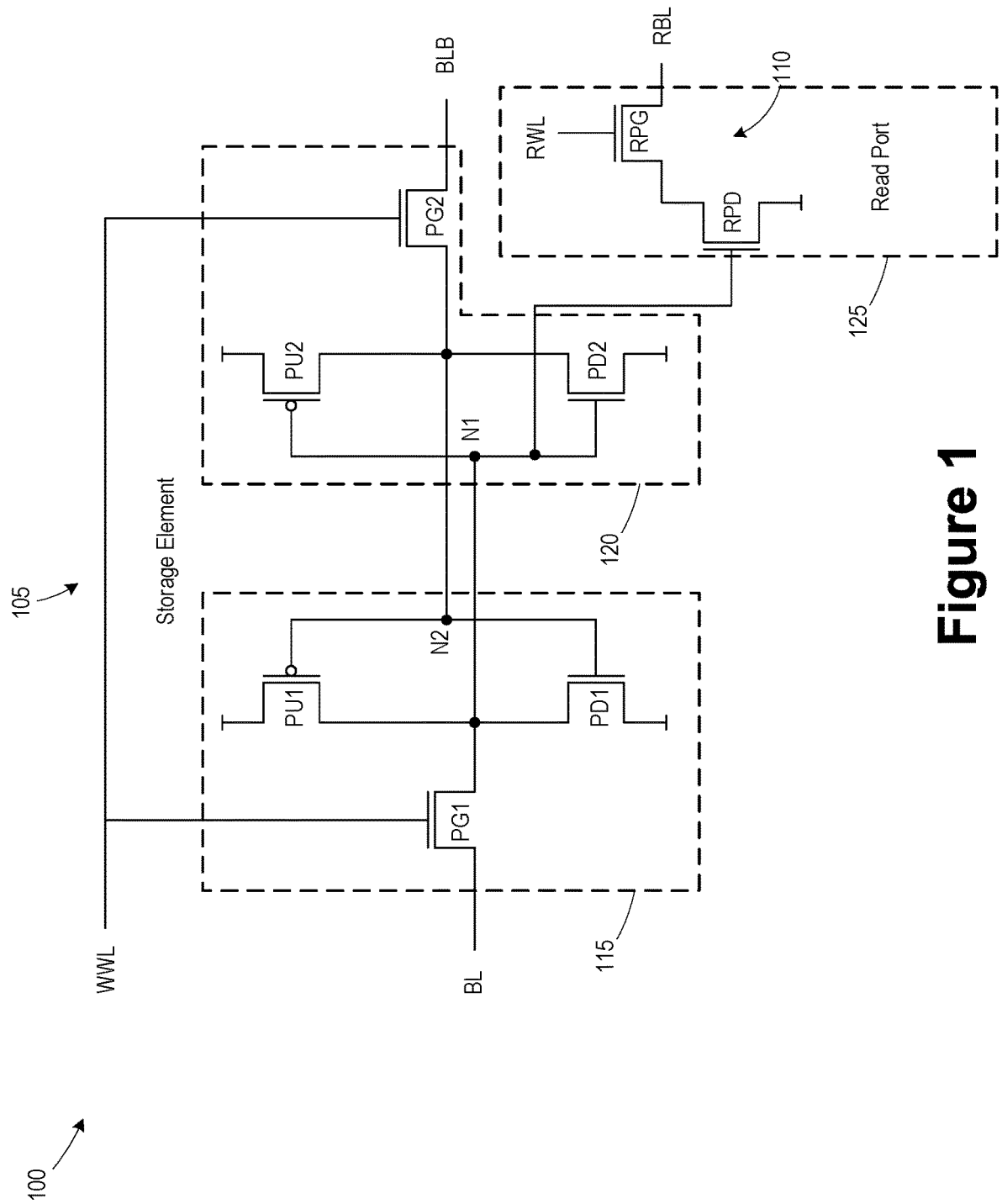
FIG. 1 is a circuit diagram of a two port SRAM.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the integrated circuit devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Referring to FIG. 1, the disclosed subject matter shall be described in the context of an SRAM memory cell 100 which includes two NMOS pass gate transistors PG1/PG2, two PMOS pull-up transistors PU1/PU2, and two NMOS pull-down transistors PD1/PD2. The source/drain region of PG1 is cross-coupled to the gates of PU2/PD2 to define a first storage node N1. The source/drain region of PG2 is cross-coupled to the gates of PU1/PD1 to define a second storage node N2. The cross-coupled transistors PU1/PD1, PU2/PD2 define a storage element 105. Data is read out of the storage element 105 of the SRAM cell 100 in a non-destructive manner using a read port 110 including an NMOS pull-down transistor RPD and an NMOS pass gate transistor RPG. Although the various transistors in the SRAM cell 100 are illustrated as being N or P type devices, it is contemplated that complementary devices may be used and logic signals may be inverted accordingly to achieve the same logical results. The SRAM cell 100 is implemented using stacked CFET nano-sheet devices 115, 120 for PU1/PD1 and PU2/PD2, respectively, and a stacked NFET nano-sheet device 125 for the RPD and RPG transistors of the read port 110.

Figure 2:
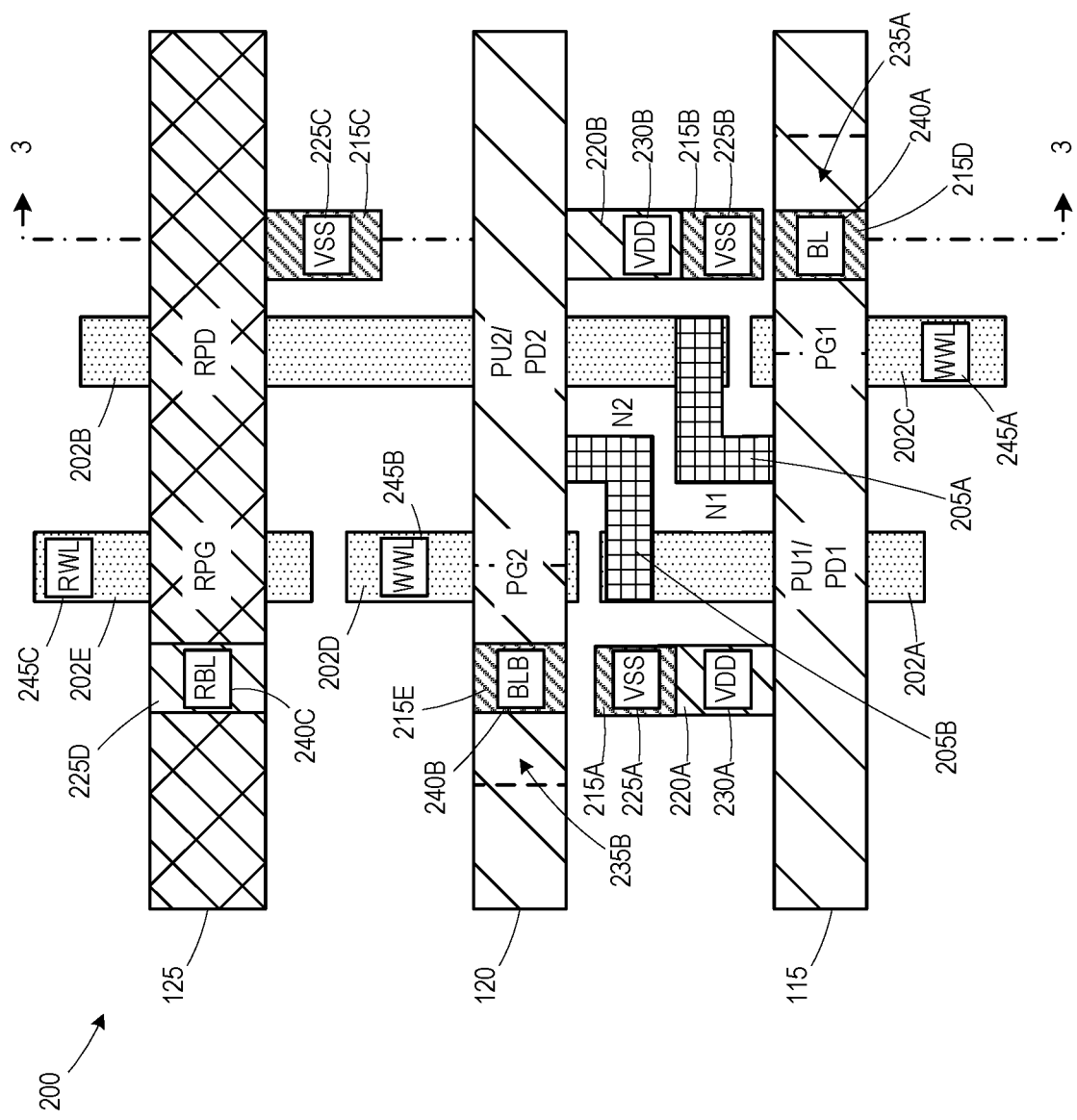
FIGS. 2 and 3 are top and cross-sectional views of a two port SRAM constructed using complementary nano-sheet transistor devices, respectively.
Figure 3:
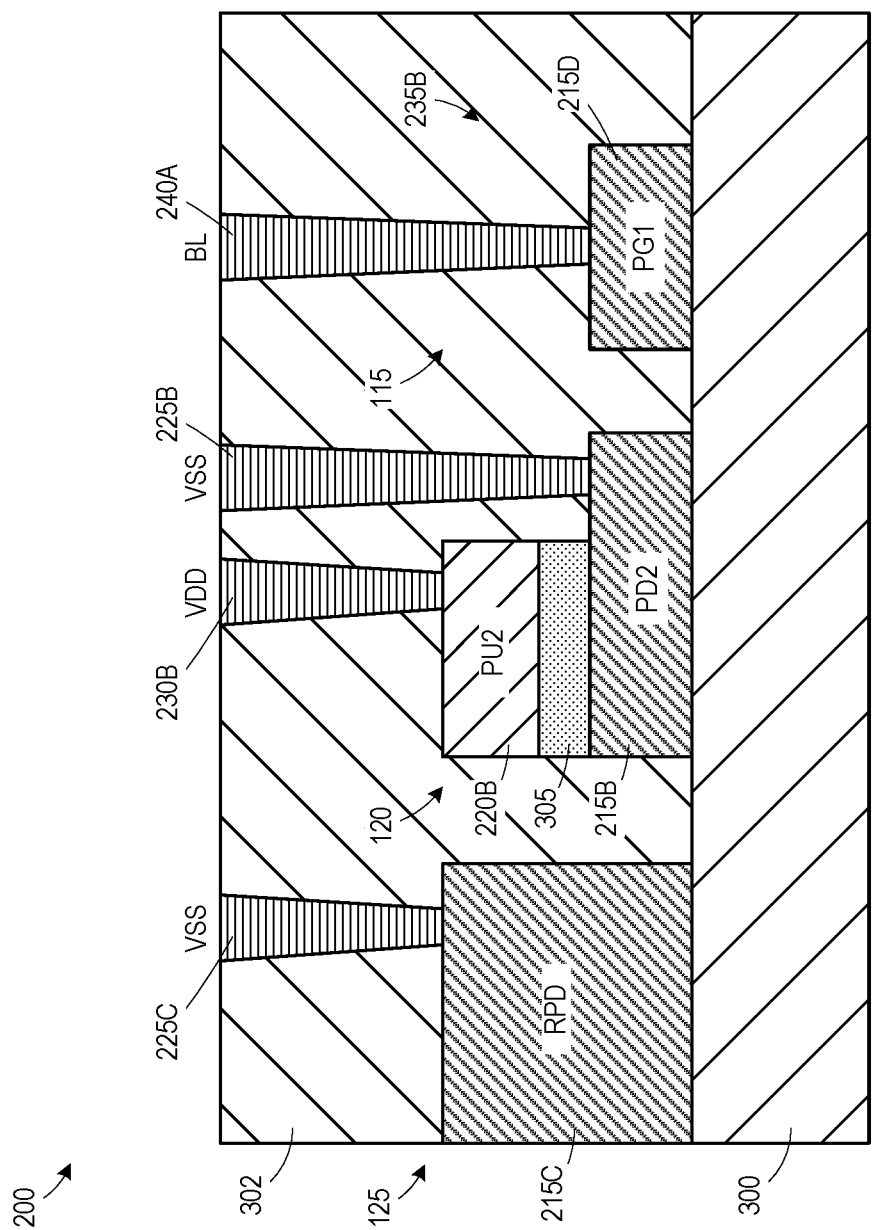

FIG. 2 is a top view of an integrated circuit product 200 implementing the SRAM cell 100, and FIG. 3 is a simplified cross-sectional view of the integrated circuit product 200 cell taken along line "3-3" in FIG. 2. The stacked CFET nano-sheet devices 115, 120, and the stacked NFET nano-sheet device 125 are formed above an isolation structure 300 (e.g., STI structure) (see FIG. 3). The stacked CFET nano-sheet devices 115, 120 and the stacked NFET nano-sheet device 125 are arranged in rows. The stacked CFET nano-sheet device 115 includes an N-type layer or stack of layers for PD1 and PG1, and a P-type layer or stack of layers for PU1. Similarly, the CFET nano-sheet device 120 includes an N-type layer or stack of layers for PD2 and PG2, and a P-type layer or stack of layers for PU2. The stacked NFET nano-sheet device 125 includes an N-type stack of layers for RPG and RPD. Since the entire stack in the stacked NFET nano-sheet device 125 may be used for RPG and RPD, the drive strength may be increased relative to the CFET devices without increasing the footprint. The drive strength may also be modulated based on the width of the stacked NFET nano-sheet device 125. For example, the stacked NFET nano-sheet device 125 may be wider than the stacked CFET nano-sheet devices 115, 120 in a direction parallel to the gate structures 202A-202E.

Gate structures 202A-202E are provided. The gate structures 202A-202E are gate all around (GAA) structures that wrap around and between the nano-sheets that make up the nano-sheet devices 115, 120, 125, as illustrated in greater detail below. The gate structure 202A is shared by PU1 and PD1. The gate structure 202B is shared by PU2, PD2, and RPD. The gate structure 202C is associated with PG1. The gate structure 202D is associated with PG2. The gate structure 202E is associated with RPG.

A cross-connect line 205A couples the source/drain regions of PG1, PD1, PU1 to the shared gate electrode 202B for PU2, PD2, RPD to define the storage node N1. The cross-connect line 205A extends vertically to contact the top and bottom S/D regions of PU1, PD1. A cross-connect line 205B couples the S/D regions of PG2, PD2, PU2 to the shared gate electrode 202A for PU1, PD1 to define the storage node N2. The cross-connect line 205B extends vertically to contact the top and bottom S/D regions of PU2, PD2.

In general, S/D regions for transistors extend between the gate structures 202A-202E. For ease of illustration, only portions of the S/D regions are illustrated in FIG. 2. The lower S/D regions of the stacked CFET nano-sheet devices 115, 120 are N-type, and the upper S/D regions are P-type. In some regions, the P-type S/D regions overlap the N/type S/D regions, while in other regions the upper P-type S/D region is absent exposing the underlying N-type S/D region (shown in more detail in FIG. 3). The S/D regions may also extend laterally in directions perpendicular to the nano-sheet devices 115, 120, 125.

An N-type S/D region lateral extension 215A of PD1 extends further than an overlying P-type S/D region lateral extension 220A for PU1. A VSS contact 225A connects to the N-type S/D region lateral extension 215A, and a VDD contact 230A connects to the P-type S/D region lateral extension 220A. Similarly, an N-type S/D region lateral extension 215B of PD2 extends further than an overlying P-type S/D region lateral extension 220B for PU2. As shown in FIG. 3, a dielectric layer 302 is formed above the stacked CFET nano-sheet devices 115, 120 and the stacked NFET nano-sheet device 125. A spacer 305 is provided between the S/D region lateral extensions 215B, 220B. A VSS contact 225B connects to the N-type S/D region lateral extension 215B, and a VDD contact 230B connects to the P-type S/D region lateral extension 220B. A VSS contact 225C connects to an N-type S/D region lateral extension 215C associated with RPD.

Upper portions of the P-type S/D regions of the stacked CFET nano-sheet devices 115, 120 in regions 235A, 235B (shown with dashed lines) are removed to allow bit line contacts 240A, 240B (BL and BLB) to contact the lower N-type S/D regions 215D, 215E of the nano-sheets for PG1, PG2, respectively. A read bit line contact 240C (RBL) contacts an upper S/D region 225D for RPG.

Write wordline contacts 245A, 245B (WWL) contact the gate structures 202C, 202D, respectively. A read wordline contact 245C (RWL) contacts the gate structure 202E.

Figure 4:
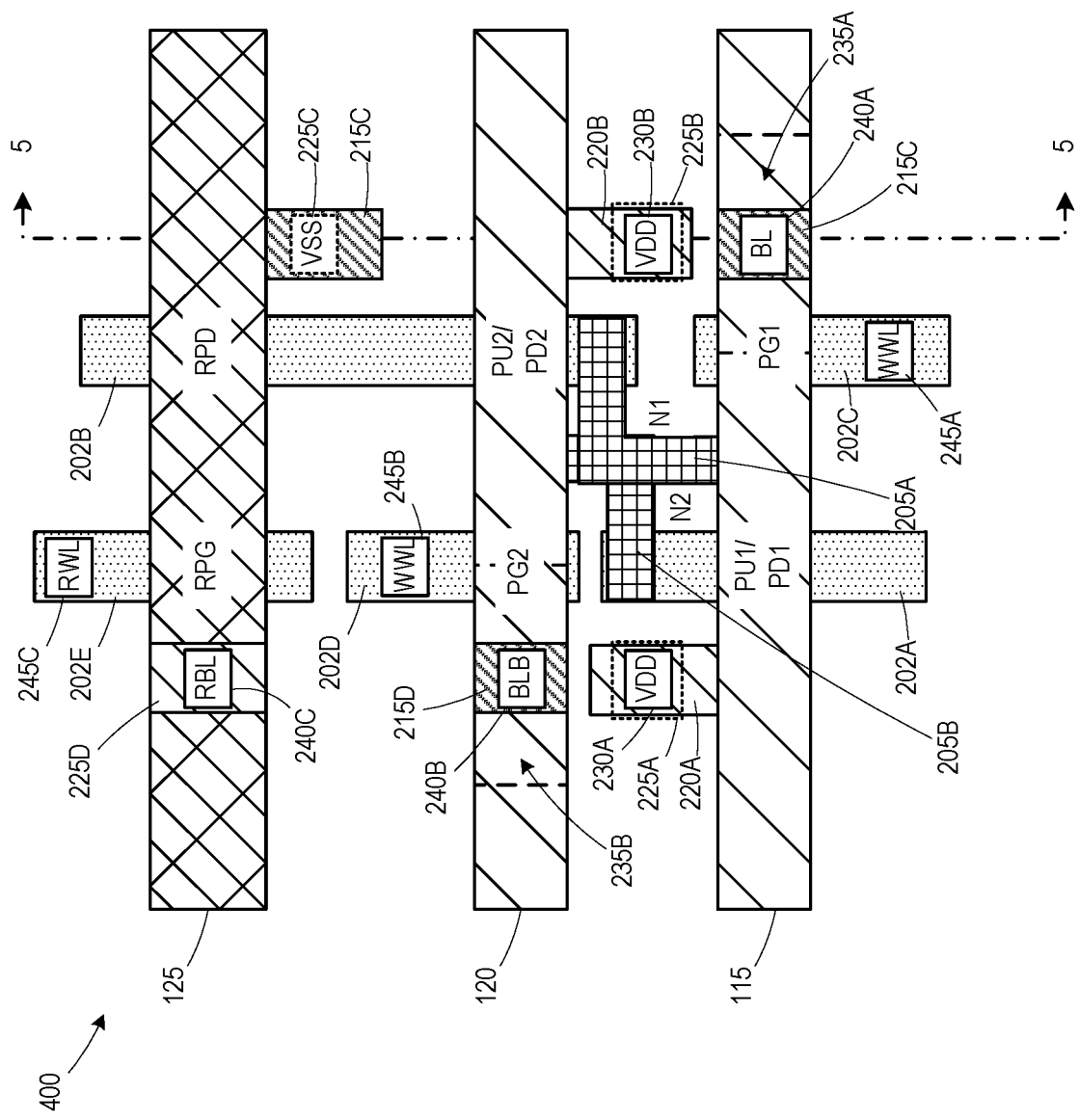
FIGS. 4 and 5 are top and cross-sectional views of a two port SRAM constructed using complementary nano-sheet transistor devices and buried VSS lines, respectively.
Figure 5:
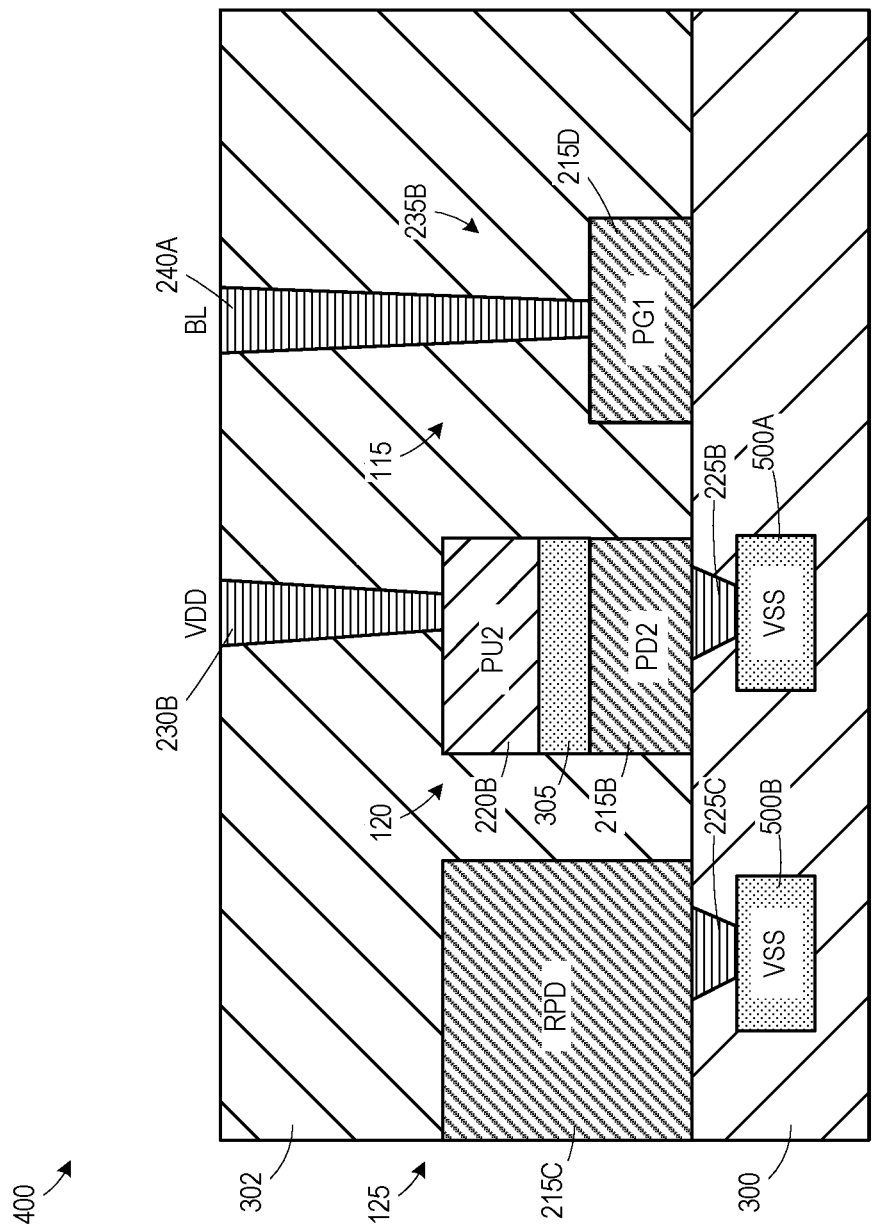

FIGS. 4 and 5 illustrate top and cross-sectional views of an alternative embodiment of an integrated circuit product 400 implementing the SRAM cell 100 employing buried VSS lines 500A, 500B (shown in FIG. 5). The N-type S/D region lateral extensions 215A, 215B of PD1 and PD2, respectively are not visible, since the P-type S/D region lateral extensions 220A, 220B of PD1 and PD2 are positioned thereabove. The VSS line 500A may extend below the N-type S/D region lateral extensions 215A, 215B in the STI structure 300. The VSS contacts 225B, 225C (shown in dashed lines in FIG. 4) are embedded in the STI structure 300 below the stacked CFET nano-sheet devices 120 and the stacked NFET nano-sheet device 125. The cross-connect lines 205A, 205B may be formed in different levels and may partially overlap when viewed in a top view in FIG. 4. Employing buried VSS lines 500A, 500B reduces the footprint of the SRAM cell 100 as the stacked CFET nano-sheet devices 115, 120 may be formed closer together.

FIGS. 6A-6I illustrate a method for forming the CFET nano-sheet devices 115, 120 and the stacked NFET nano-sheet device 125. In the examples depicted herein, the integrated circuit product 600 will be formed in and above a semiconductor substrate 610. A plurality of semiconductor material layers 620, 625, 627 was formed above an isolation structure 612 formed above the substrate 610. The isolation structure 612 may be a buried insulating layer of a semiconductor-on-insulator (SOI) substrate. The substrate 610 may be made of silicon or it may be made of materials other than silicon, e.g., silicon-germanium, a III-V compound semiconductor material, etc. Thus, the terms "substrate" or "semiconductor substrate" should be understood to cover all semiconducting materials and all forms of such materials.

Figure 6A:
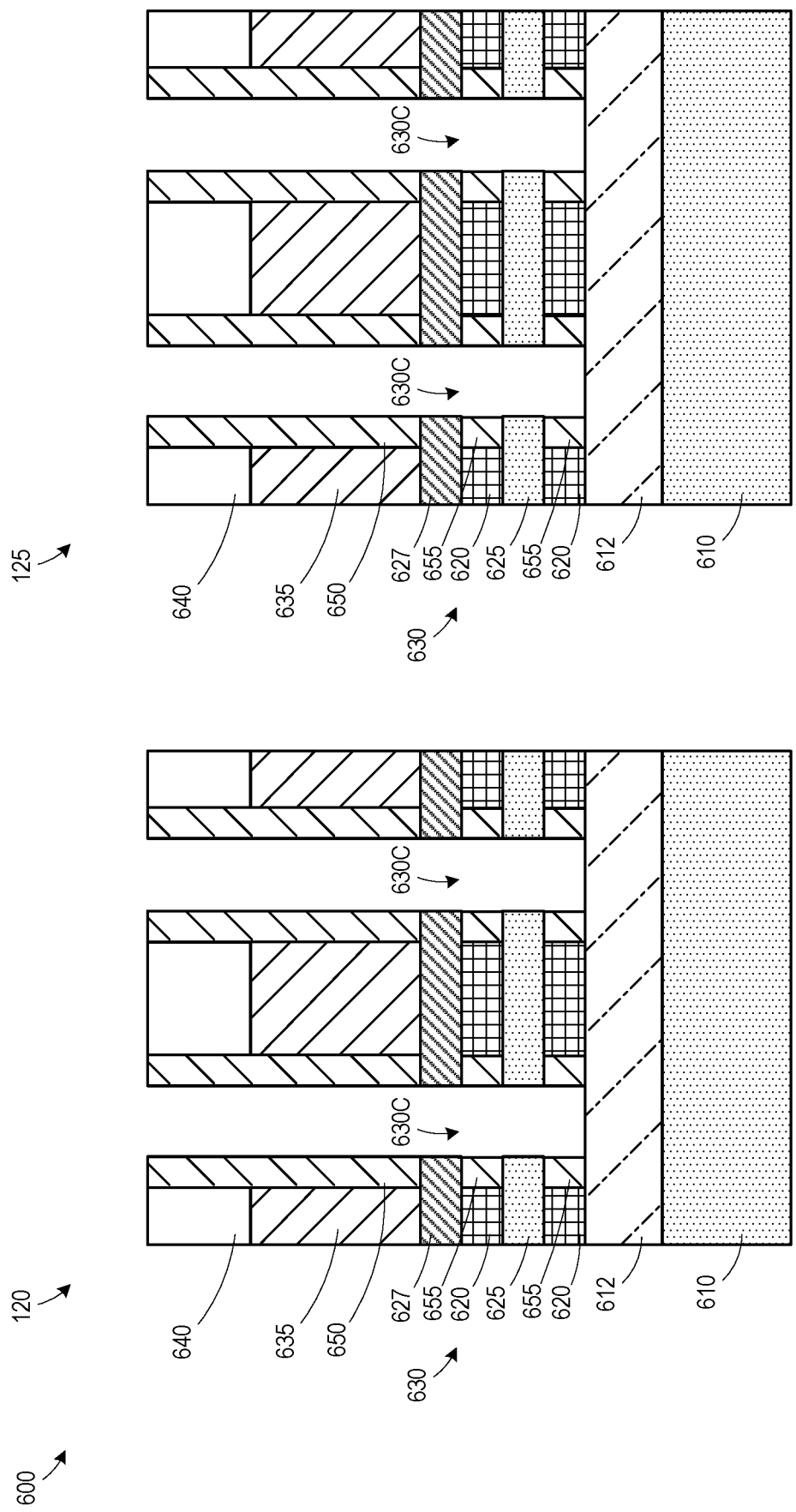
FIGS. 6A-6I illustrate a method for forming stacked CFET and NFET nano-sheet devices.

Cross-sectional views of the stacked CFET nano-sheet device 120 and the stacked NFET nano-sheet device 125 are shown. The cross-sectional views are taken in the gate length direction of the device 600 (perpendicular to the gate structures). FIG. 6A depicts the product 600 at a point in fabrication wherein several process operations have been performed. First, alternating semiconductor material layers 620, 625, 627 were formed above the substrate 610. Thereafter, a masking layer (not shown) was formed above the uppermost semiconductor material layer 627. An etching process was performed to define stacks 630. In general, the semiconductor material layers 620, 625, 627 may be made of different semiconductor materials, and they are made of materials that may be selectively removed (by etching) relative to one another. In one example depicted herein, the semiconductor material layers 620 are sacrificial in nature while the semiconductor material layers 625, 627 will become the channel region material for the nano-sheet devices 120, 125. The semiconductor material layer 625 may be a P-type channel layer and the semiconductor channel layer 627 may be an N-type channel layer. The semiconductor material 620 may comprise silicon-germanium ($Si_xGe_{(1-x)}$ where x ranges from 0.0 to 0.9) and the semiconductor material layers 625, 627 may comprise substantially pure silicon. The thicknesses of the semiconductor material layers 620, 625, 627 may vary depending upon the particular application and they need not have the same thicknesses, although they may in some applications. In one illustrative embodiment, the semiconductor material layers 620 may have a thickness of about 8-15 nm, while the semiconductor material layers 625, 627 (i.e., the channel materials) may have a thickness of about 6-10 nm. The number of semiconductor material layers 620, 625, 627 that are formed may also vary depending upon the particular application. In the illustrative example depicted herein, one channel layer 625, 627 is provided for each device type. In other embodiments, multiple layers of channel material may be provided for each device type.

The semiconductor material layers 620, 625, 627 may be formed using a variety of techniques. In one illustrative example, where the substrate 610 is an SOI substrate, the substrate may be obtained from the substrate supplier with an active layer comprising the first semiconductor material layer 620. Alternatively, the active layer of the SOI substrate may be silicon as originally supplied by the substrate supplier. The active silicon layer may be converted to a layer of silicon germanium by epitaxially depositing a germanium-containing material (e.g., SiGe) or germanium on the silicon active layer, and thereafter performing an anneal process to cause the germanium in the germanium or silicon germanium layer to diffuse into the silicon active layer. In yet another example, the substrate 610 may be a simple bulk silicon substrate. In that case, the first semiconductor material layer 620, e.g., silicon germanium, may be epitaxially deposited on the upper surface of the bulk silicon substrate. Irrespective of how the first semiconductor material layer 620 is formed, the subsequent semiconductor material layers 620, 625, 627 may be sequentially deposited on the substrate 610 by performing multiple epitaxial deposition processes.

After forming the stacks 630, gate structures 635 were formed thereabove, contacting top and sidewall surfaces of the stacks 630. In the illustrated embodiment, the gate structures 635 are sacrificial in nature in that they are replaced at a later point in the process flow with other materials to form functional gate structures, as described below. The gate structures 635 may include one or more layers of material, such as a sacrificial gate insulation layer (e.g., silicon dioxide), and a sacrificial gate material (e.g., amorphous silicon)—not separately shown. A cap layer 640 (e.g., silicon nitride) formed from patterned hard mask layers employed to pattern the gate structures 635 is positioned above the gate structures 635. A sidewall spacer 650 (e.g., silicon nitride) was formed on sidewalls of the gate structures 635. In one embodiment, the sidewall spacer 650 may be formed by depositing a conformal layer of spacer material and performing an anisotropic etch process on the layer of spacer material.

One or more etch processes were performed to recess portions of the stacks 630 to define cavities 630C and a plurality of processes was performed to form end spacers 655 adjacent the semiconductor material layers 620. An isotropic etch process was performed to recess the semiconductor material layers 620 to define end recesses on ends of the semiconductor material layers 620. A conformal deposition process, such as an ALD process, was performed to form a layer of insulating material (e.g., silicon nitride) above the product 600. An etch process was performed to remove portions of the layer of insulating material not positioned in the end recesses.

Figure 6B:
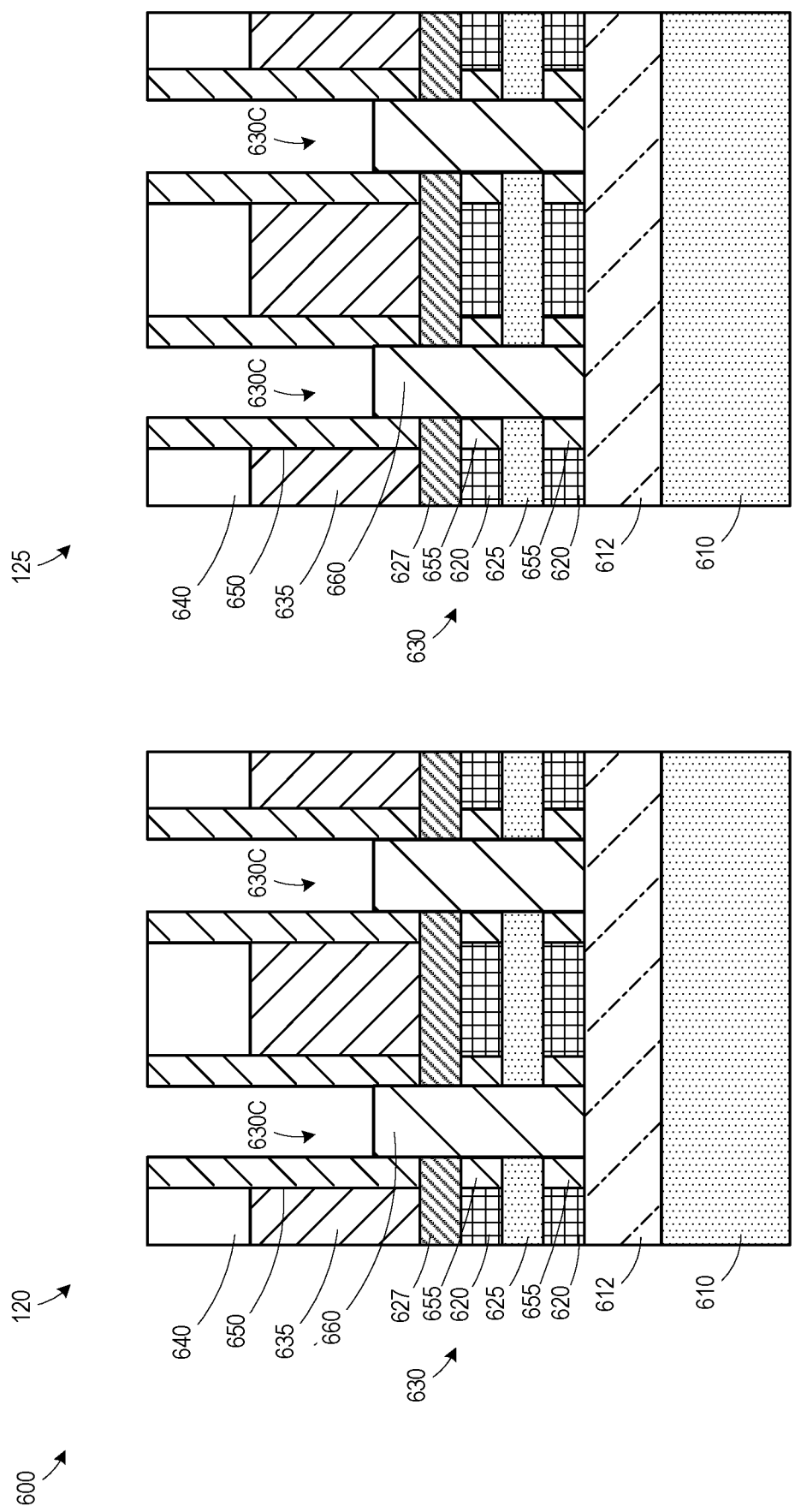

FIG. 6B illustrates the product 600 after an epitaxial deposition process was performed to define N-type source/drain material 660 in the cavities 630C. The N-type source/drain material 660 may be doped in situ during the growth process, or implantation processes may be completed at a later time to dope the N-type source/drain material 660. The N-type source/drain material 660 may be formed such that it fills a substantial portion of the cavities 630C. The N-type source/drain material 660 is the source/drain region of PD1 or PD2.

Figure 6C:
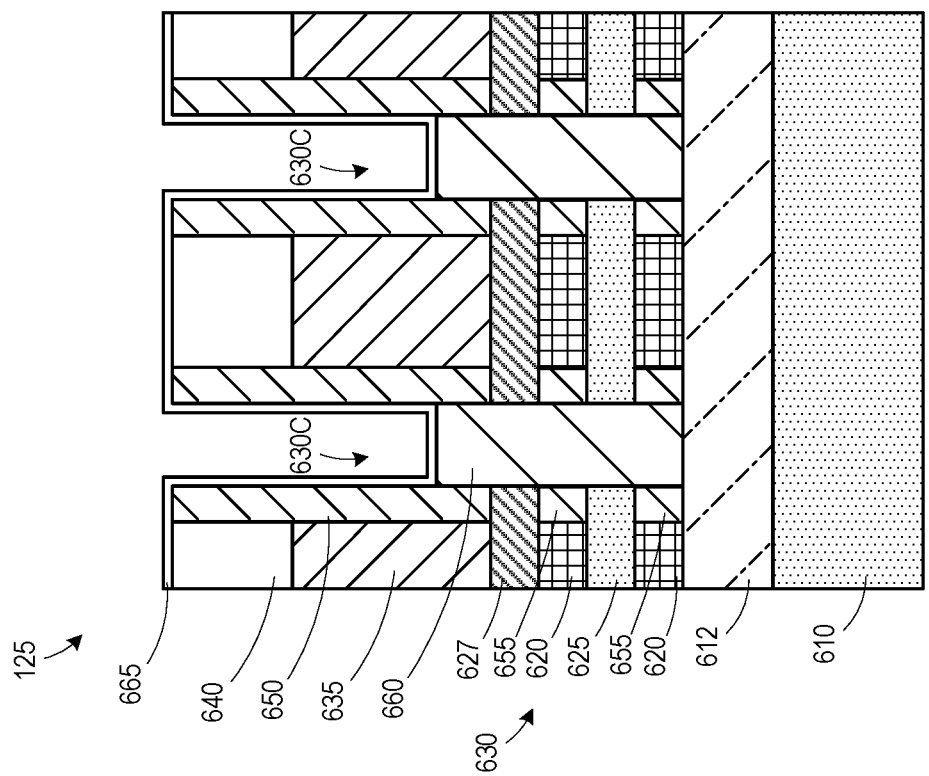
Figure 6C:
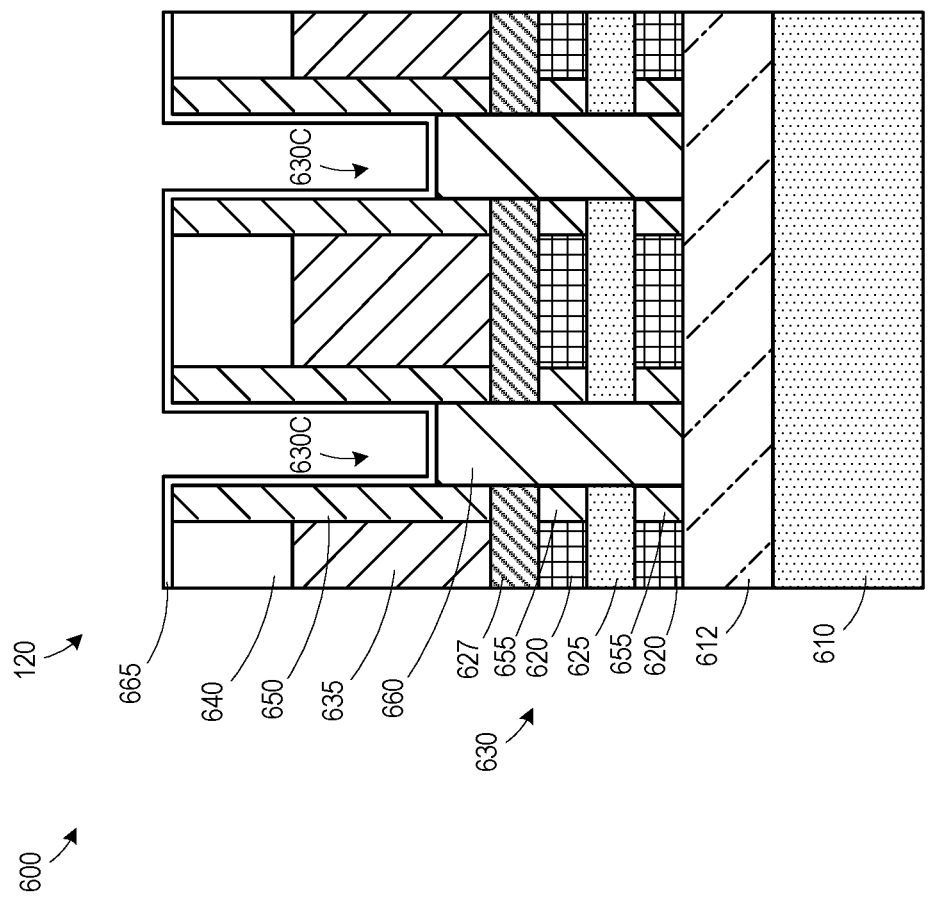

FIG. 6C illustrates the product 600 after a conformal deposition process was performed to form a liner 665 (e.g., SiN) in the cavities 630C.

Figure 6D:
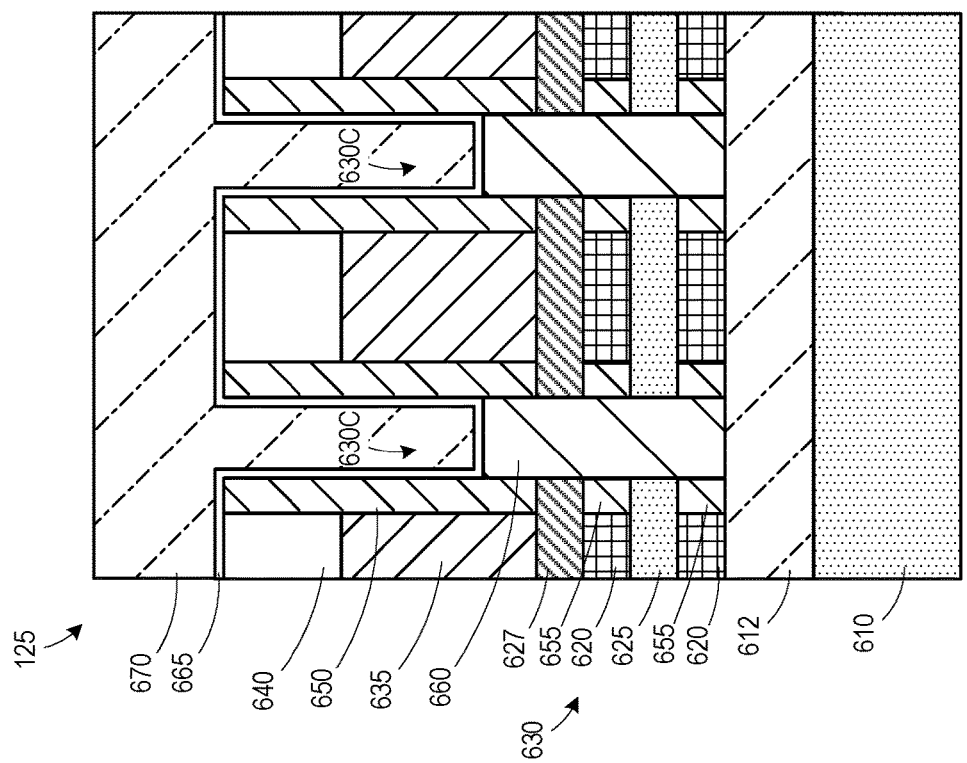
Figure 6D:
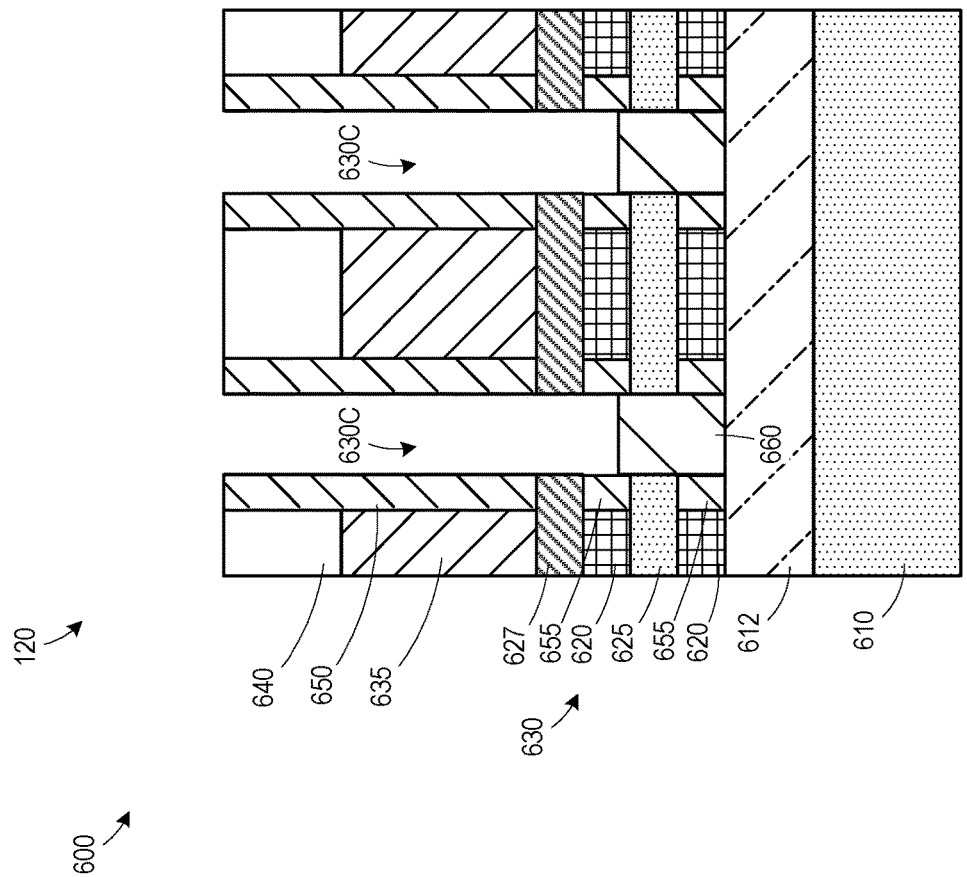

FIG. 6D illustrates the product 600 after a mask layer 670 (e.g., organic patterning layer (OPL)) was formed above the CFET nano-sheet device 120 and the stacked NFET nano-sheet device 125 and patterned to expose the CFET nano-sheet device 120 and cover the stacked NFET nano-sheet device 125. An etch process was performed to remove the liner 665 from the CFET nano-sheet device 120. A subsequent etch process was performed to recess the N-type source/drain material 660 in the stacked CFET nano-sheet device 120.

Figure 6E:
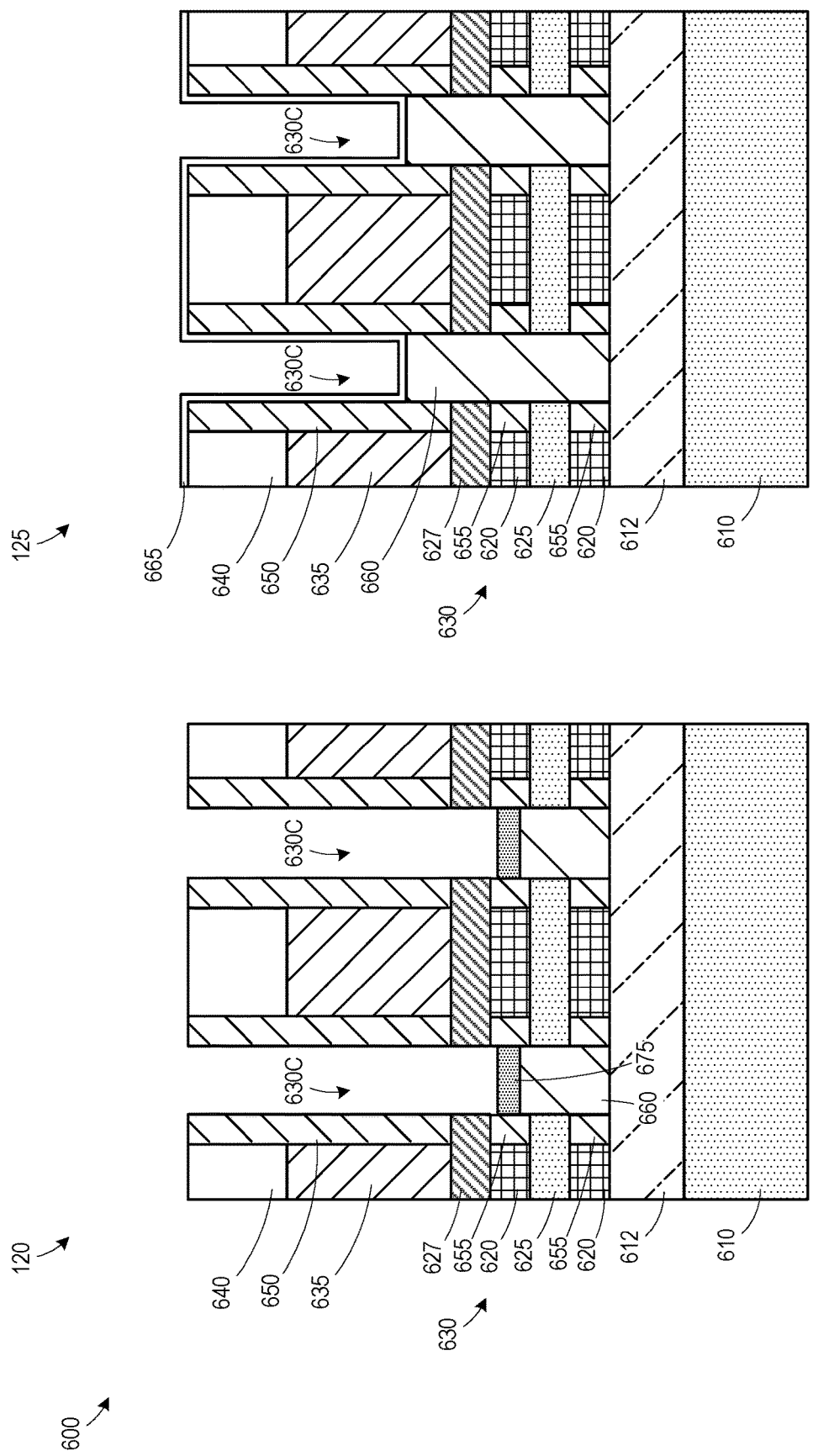

FIG. 6E illustrates the product 600 after several processes were performed. The mask layer 670 was removed. A deposition process was performed to form a dielectric layer (e.g., silicon dioxide, a low-k material, etc.) in the cavities 630C and an etch process was performed selective to the liner 665 to recess the dielectric layer to define spacers 675 in the cavities 630C of the CFET nano-sheet device 120 while removing the dielectric layer from the cavities 630C of the stacked NFET nano-sheet device 125.

Figure 6F:
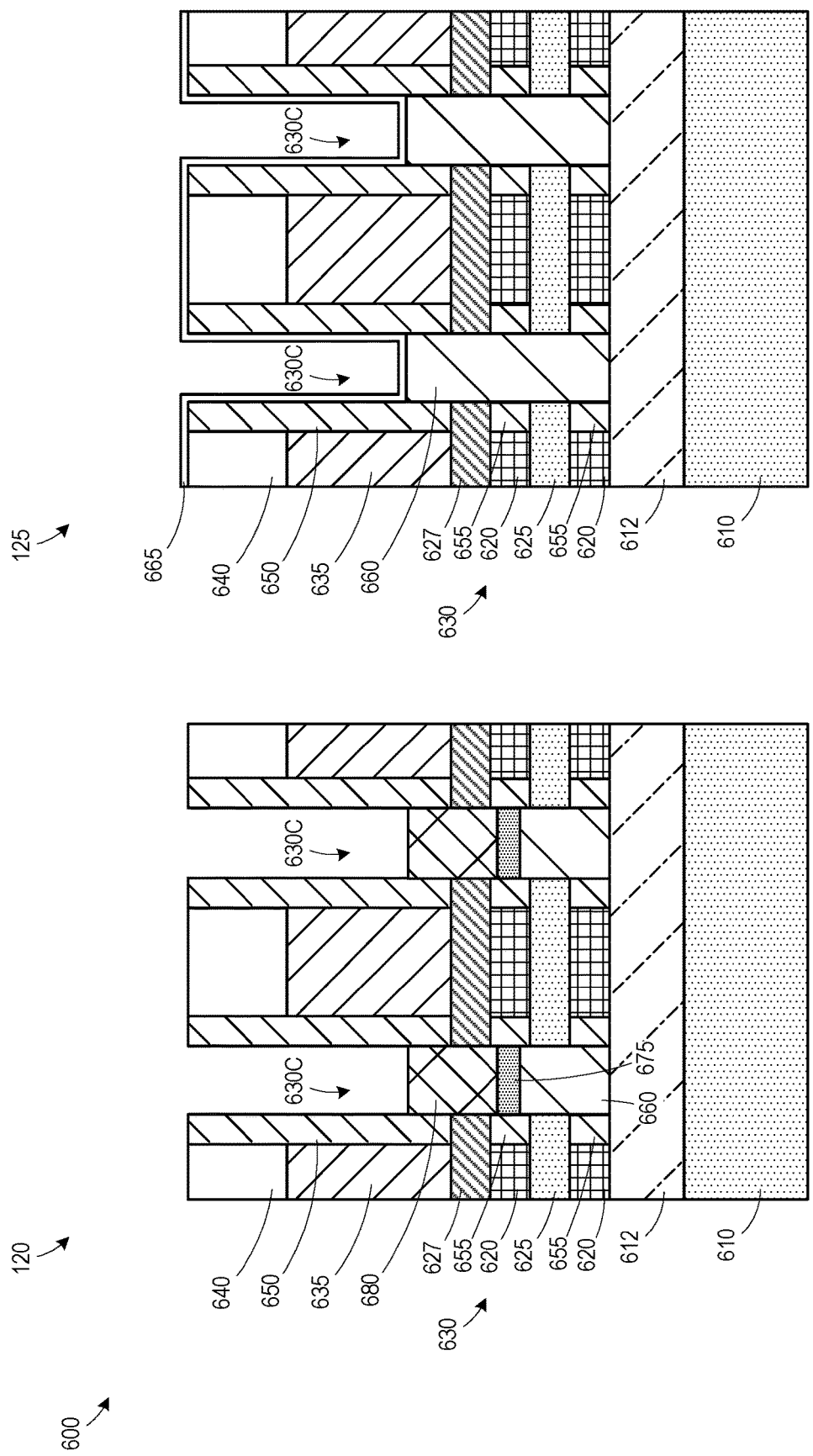

FIG. 6F illustrates the product 600 after an epitaxial deposition process was performed to define P-type source/drain material 680 in the cavities 630C of the stacked CFET nano-sheet device 120. The P-type source/drain material 680 may be doped in situ during the growth process, or implantation processes may be completed at a later time to dope the P-type source/drain material 680. The P-type source/drain material 680 may be formed such that it fills a substantial portion of the cavities 630C of the stacked CFET nano-sheet device 120 and etched back to reduce the height. The P-type source/drain material 680 is the source/drain region of PU1 or PU2.

Figure 6G:
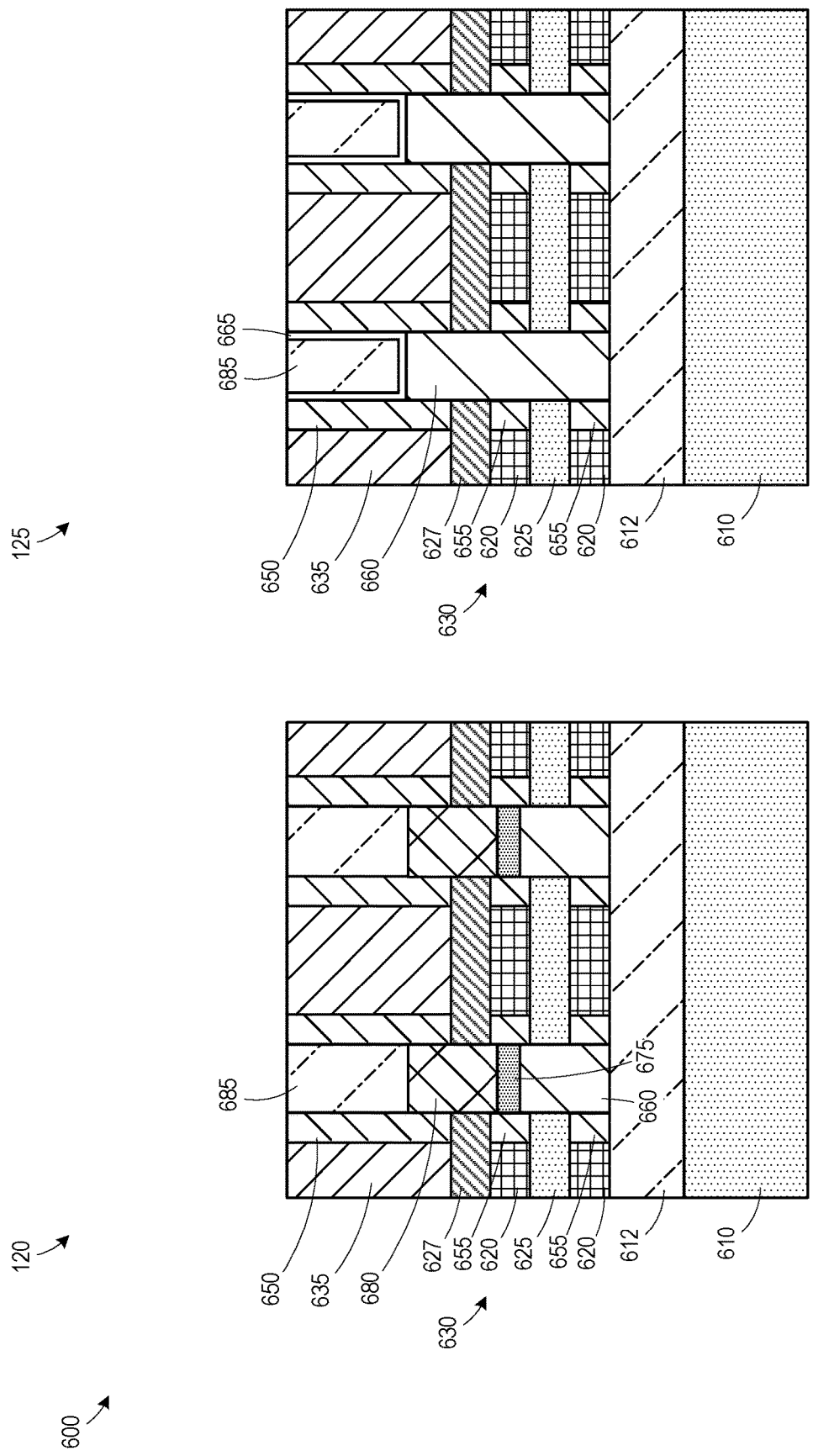

FIG. 6G illustrates the product 600 after several processes were performed. A plurality of processes (e.g., deposition, planarization) was performed to form a dielectric layer 685 (e.g., silicon dioxide, low-k dielectric layer, ultra-low-k dielectric layer, etc.) in the cavities 630C. A planarization process was performed to remove portions of the dielectric layer 685 outside the cavities 630C. The planarization process also removes the cap layers 640 and reduces the height of the spacers 650.

Figure 6H:
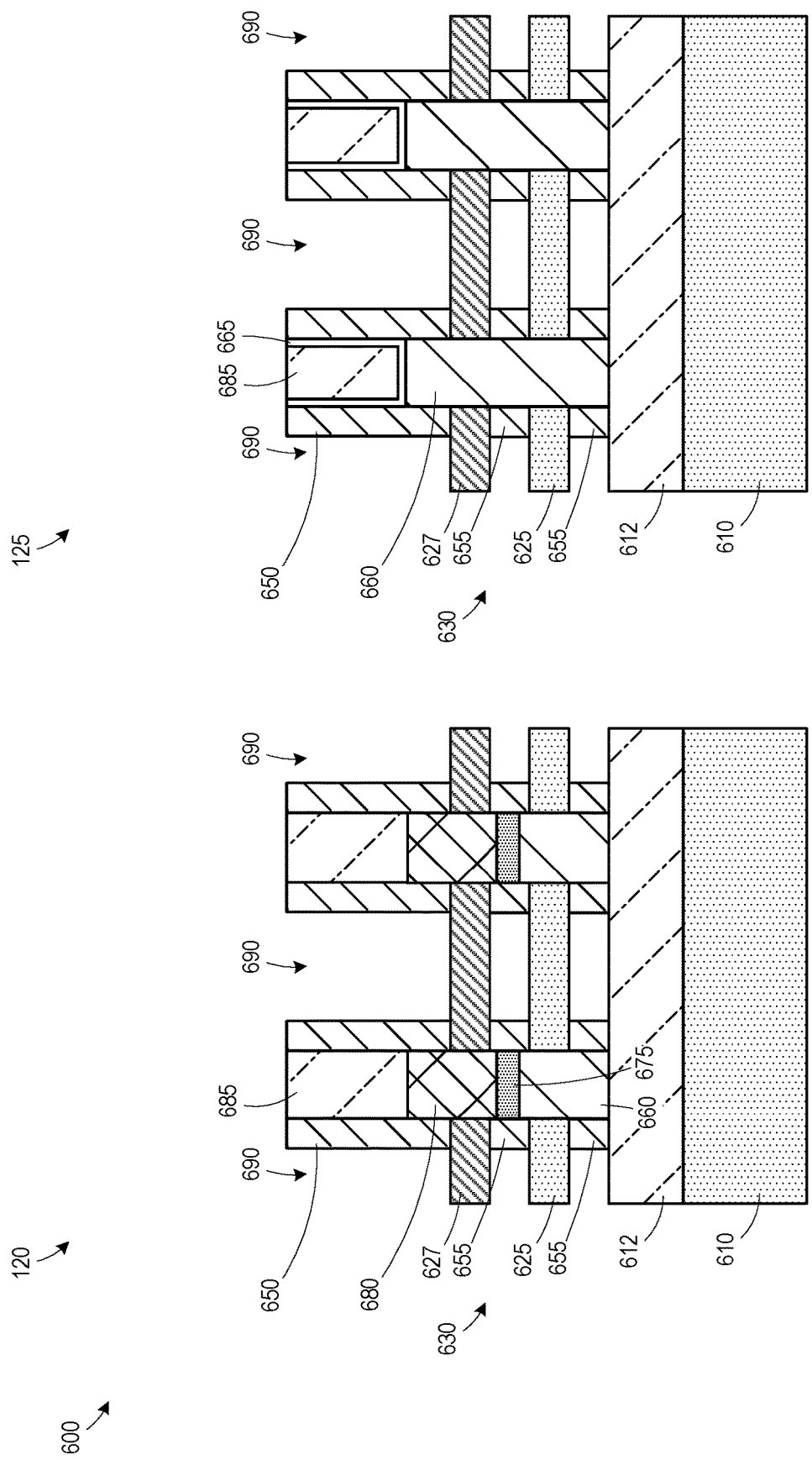

FIG. 6H illustrates the product 600 after one or more etch processes were performed to remove the gate structures 635 (i.e., the sacrificial gate material and underlying sacrificial gate insulation layer), and the semiconductor material layers 620 to define replacement gate cavities 690. This process operation results in the formation of vertically spaced-apart semiconductor material layers 625, 627 within the gate cavities 690 with open spaces disposed therebetween in what will become the channel regions for the nano-sheet devices.

Figure 6I:
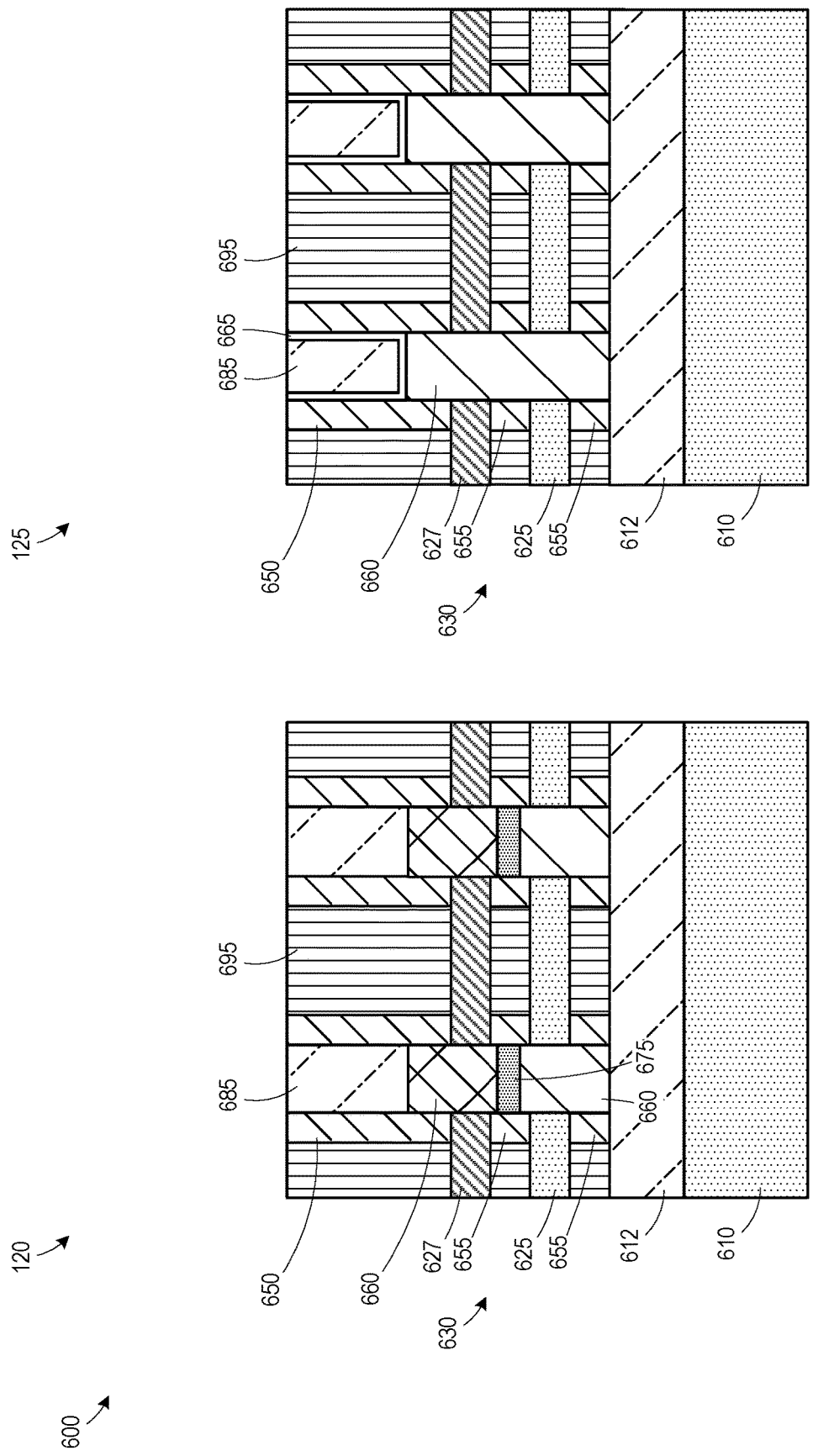

FIG. 6I illustrates the product 600 after a plurality of deposition processes was performed to define a replacement gate structure 695 in the gate cavities 690. The replacement gate structures 695 may include multiple layers (not separately illustrated), such as a gate insulation layer (e.g., silicon dioxide, a high-k insulation material (e.g., k greater than 10), etc.) and gate electrode material (e.g., one or more conductive materials, such as a barrier layer, a work function material layer, a seed layer, a metal fill layer, etc.). Note that the nano-sheet devices 120, 125 shown in FIG. 6I are gate-all-around (GAA) devices in that the spaces between the spaced-apart channel semiconductor material layers 625, 627 are filled with the material of the replacement gate electrodes 695.

FIGS. 7A-7I illustrate a method for selectively removing the top nano-sheet of a stack. This process may be used to form the regions 235A, 235B in the stacked CFET nano-sheet devices 115, 120 shown in FIGS. 2 and 4. In addition, in an embodiment where the stacked NFET nano-sheet device 125 does not have a larger S/D region, the top sheet may be removed at the same time.

Figure 7B:
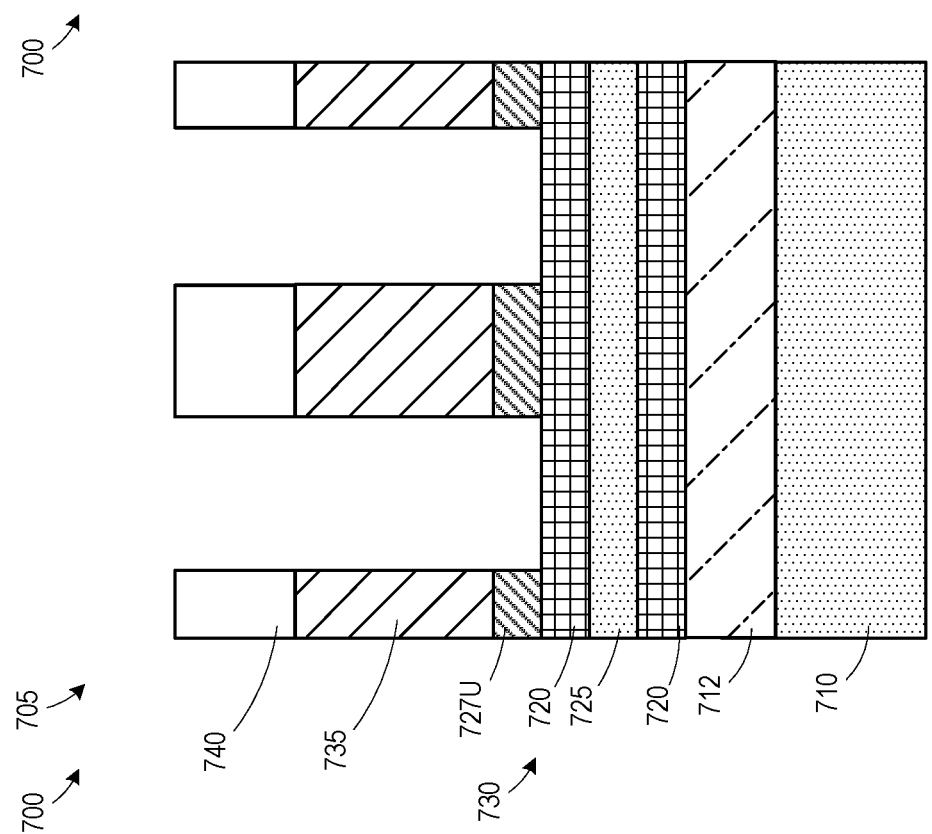
Figure 7A:
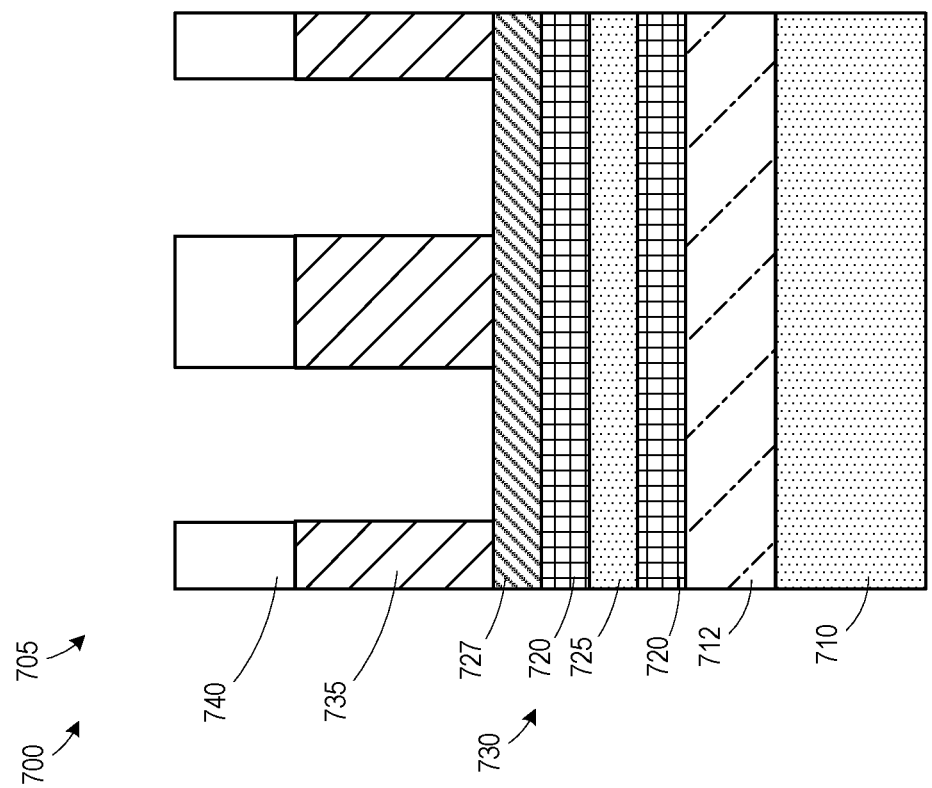

FIG. 7A illustrates a product 700 including a stacked nano-sheet device 705 after a plurality of semiconductor material layers 720, 725, 727 was formed above an isolation structure 712 formed above the substrate 710. The isolation structure 712 may be a buried insulating layer of a semiconductor-on-insulator (SOI) substrate. FIG. 7A depicts the product 700 at a point in fabrication wherein several process operations have been performed. First, alternating semiconductor material layers 720, 725, 727 were formed above the substrate 710. Thereafter, a masking layer (not shown) was formed above the uppermost semiconductor material layer 727. An etching process was performed to define stacks 730. In general, the semiconductor material layers 720, 725, 727 may be made of different semiconductor materials, and they are made of materials that may be selectively removed (by etching) relative to one another. In one example depicted herein, the semiconductor material layers 720 are sacrificial in nature while the semiconductor material layers 725, 727 will become the channel region material for the nano-sheet device 705. The semiconductor material layer 725 may be a P-type channel layer and the semiconductor channel layer 727 may be an N-type channel layer. The semiconductor material 720 may comprise silicon-germanium ($Si_xGe_{(1-x)}$ where x ranges from 0.0 to 0.9) and the semiconductor material layers 725, 727 may comprise substantially pure silicon. The thicknesses of the semiconductor material layers 720, 725, 727 may vary depending upon the particular application and they need not have the same thicknesses, although they may in some applications.

After forming the stacks 730, gate structures 735 were formed thereabove, contacting top and sidewall surfaces of the stacks 730. In the illustrated embodiment, the gate structures 735 are sacrificial in nature in that they are replaced at a later point in the process flow with other materials to form functional gate structures, as described below. The gate structures 735 may include one or more layers of material, such as a sacrificial gate insulation layer (e.g., silicon dioxide), and a sacrificial gate material (e.g., amorphous silicon)—not separately shown. A cap layer 740 (e.g., silicon nitride) formed from patterned hard mask layers employed to pattern the gate structures 735 is positioned above the gate structures 735.

FIG. 7B illustrates the product 700 after an etch process was performed to remove the upper portion of the semiconductor material layer 727, thereby defining a remaining portion 727U. A mask layer (not shown) may be provided to mask areas for which the upper portion of the semiconductor material layer 727 is to be preserved (e.g., outside the regions 235A, 235B. If all or some of the upper portion of the semiconductor material layer 727 is to be removed on the stacked NFET nano-sheet device 125, the mask may expose the appropriate regions.

FIG. 7C illustrates the product after a sidewall spacer 750 (e.g., silicon nitride) is formed on sidewalls of the gate structures 735. In one embodiment, the sidewall spacer 750 may be formed by depositing a conformal layer of spacer material and performing an anisotropic etch process on the layer of spacer material. The sidewall spacer 750 covers remaining portions of the semiconductor material layer 727U.

FIG. 7D illustrates the product 700 after one or more etch processes were performed to recess portions of the stacks 730 to define cavities 730C and a plurality of processes was performed to form end spacers 755 adjacent the semiconductor material layers 720. An isotropic etch process was performed to recess the semiconductor material layers 720 to define end recesses on ends of the semiconductor material layers 720. A conformal deposition process, such as an ALD process, was performed to form a layer of insulating material (e.g., silicon nitride) above the product 700. An etch process was performed to remove portions of the layer of insulating material not positioned in the end recesses.

Figure 7F:
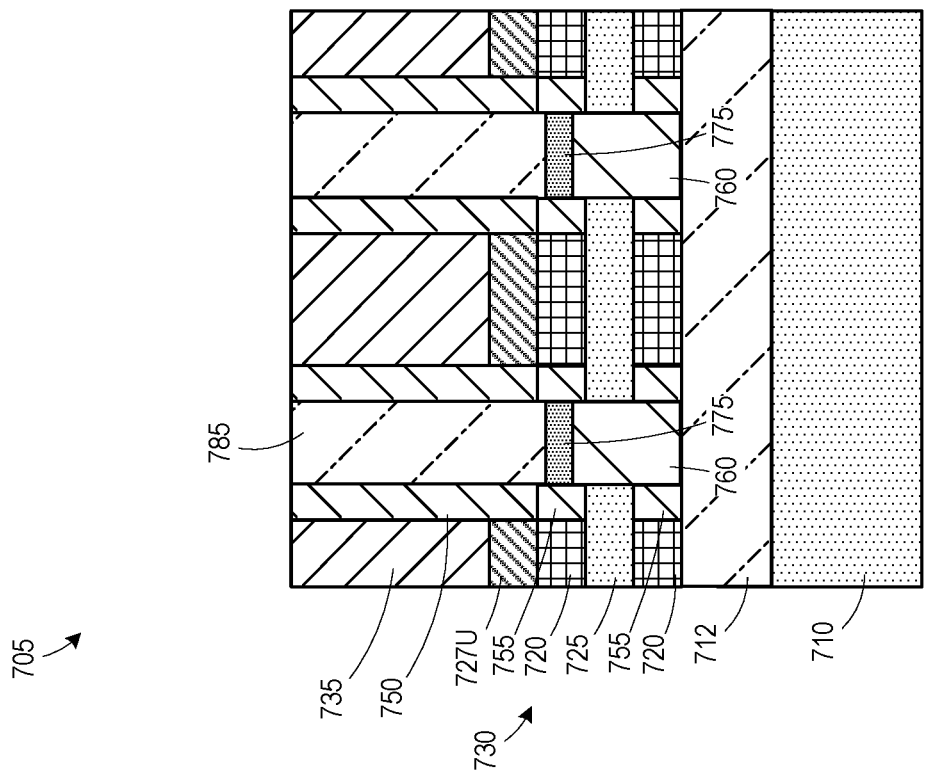
Figure 7E:
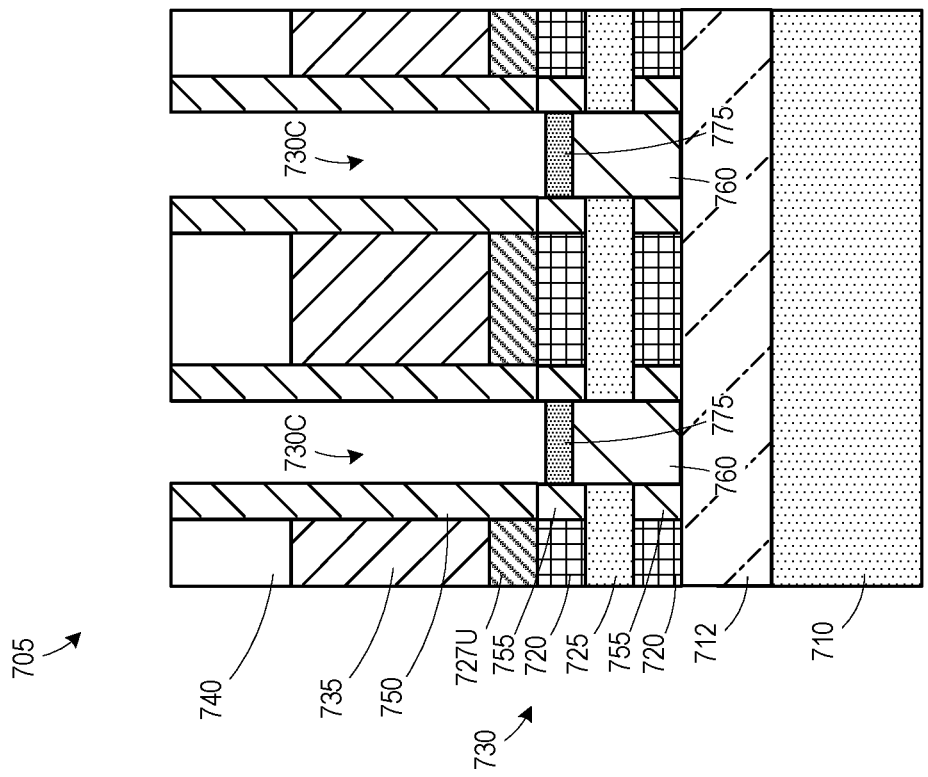

FIG. 7E illustrates the product 700 after an epitaxial deposition process was performed to define N-type source/drain material 760 in the cavities 730C (i.e., overgrowth followed by recess etch). The N-type source/drain material 760 may be doped in situ during the growth process, or implantation processes may be completed at a later time to dope the N-type source/drain material 760. A deposition process was performed to form a dielectric layer (e.g., silicon dioxide, a low-k material, etc.) in the cavities 730C and an etch process was performed to recess the dielectric layer to define spacers 775 in the cavities 730C. In the regions 235A, 235B, the N-type source/drain material 760 is the source/drain region of PD1 or PD2. Above the stacked NFET nano-sheet device 125, the N-type source/drain material 760 is the source/drain region of RPD or RPG.

A subsequent epitaxial deposition process was performed to define P-type source/drain material in the cavities of the stacked CFET nano-sheet device 120, as shown in FIG. 6F. However, because the upper semiconductor material layer 727U is covered by the sidewall spacer 750, the P-type source/drain material does not grow in the cavities 730C.

FIG. 7F illustrates the product 700 after several processes were performed. A plurality of processes (e.g., deposition, planarization) were performed to form a dielectric layer 785 (e.g., silicon dioxide, low-k dielectric layer, ultra-low-k dielectric layer, etc.) in the cavities 730C. A planarization process was performed to remove portions of the dielectric layer 785 outside the cavities 730C. The planarization process also removes the cap layers 740 and reduces the height of the spacers 750.

Figure 7H:
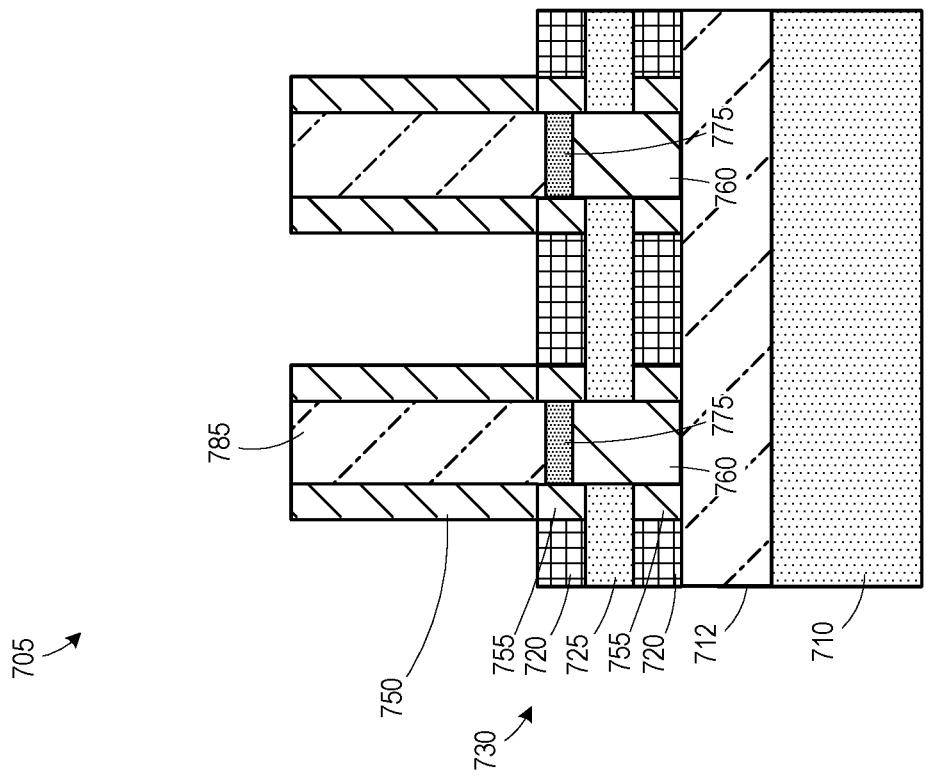
Figure 7G:
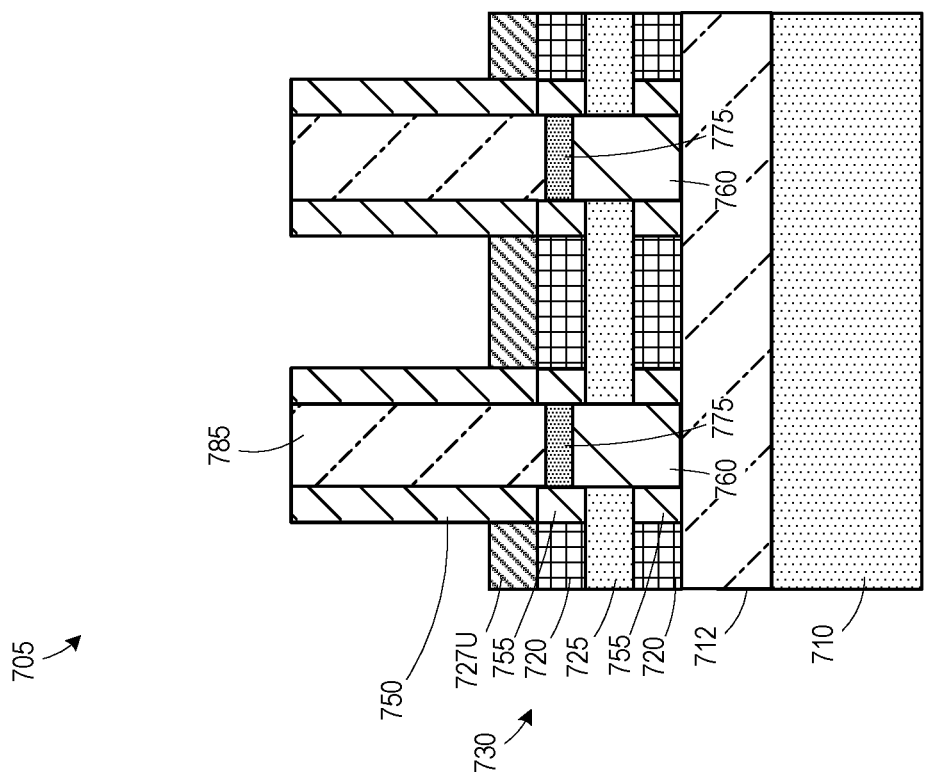

FIG. 7G illustrates the product 700 after one or more etch processes were performed to remove the gate structures 735 (i.e., the sacrificial gate material and underlying sacrificial gate insulation layer).

FIG. 7H illustrates the product 700 after a mask layer (not shown) was formed above regions where the upper semiconductor material layer 727 is to be preserved and exposing the remaining upper portion 727U. An etch process (e.g., anisotropic) was performed to remove the remaining upper portion 727U. In some embodiments, this masking and removal of the remaining upper portion 727U is optional, since the remaining upper portion 727U is isolated by the sidewall spacer 750.

Figure 7I:
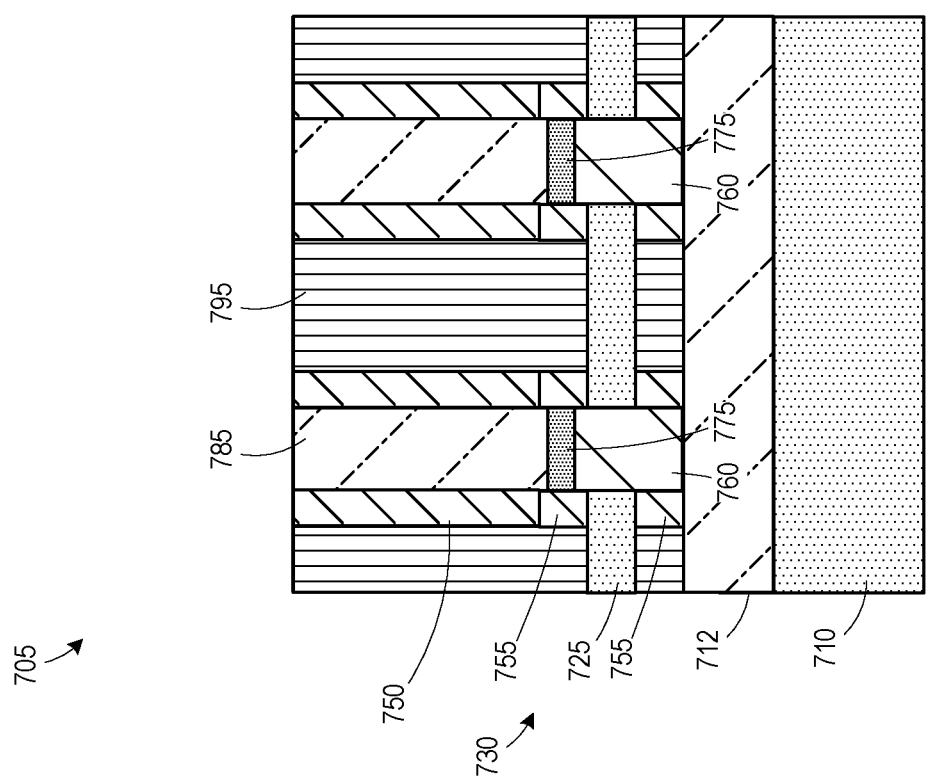

FIG. 7I illustrates the product 700 after an etch process was performed to remove the semiconductor material layers 720 and plurality of deposition processes was performed to define a replacement gate structure 795 in the resulting gate cavities. The replacement gate structures 795 may include multiple layers (not separately illustrated), such as a gate insulation layer (e.g., silicon dioxide, a high-k insulation material (e.g., k greater than 10), etc.) and gate electrode material (e.g., one or more conductive materials, such as a barrier layer, a work function material layer, a seed layer, a metal fill layer, etc.).

As described above, the process flow of FIGS. 7A-7I may be applied to form the regions 230A, 230B in FIG. 2, where the absence of the P-type source/drain material allows the bit line contacts 240A, 240B (BL and BLB) to contact the lower N-type S/D regions 215D, 215E of the nano-sheets for PG1, PG2, respectively. The process flow of FIGS. 7A-7I may also be applied to provide the stacked NFET nano-sheet device 125 with the same size S/D regions 215C as the stacked CFET nano-sheet devices 115, 120. Both aspects may be combined in a single process flow, since the mask layer described in reference to FIG. 7B can be formed to expose the appropriate regions.

Figure 8:
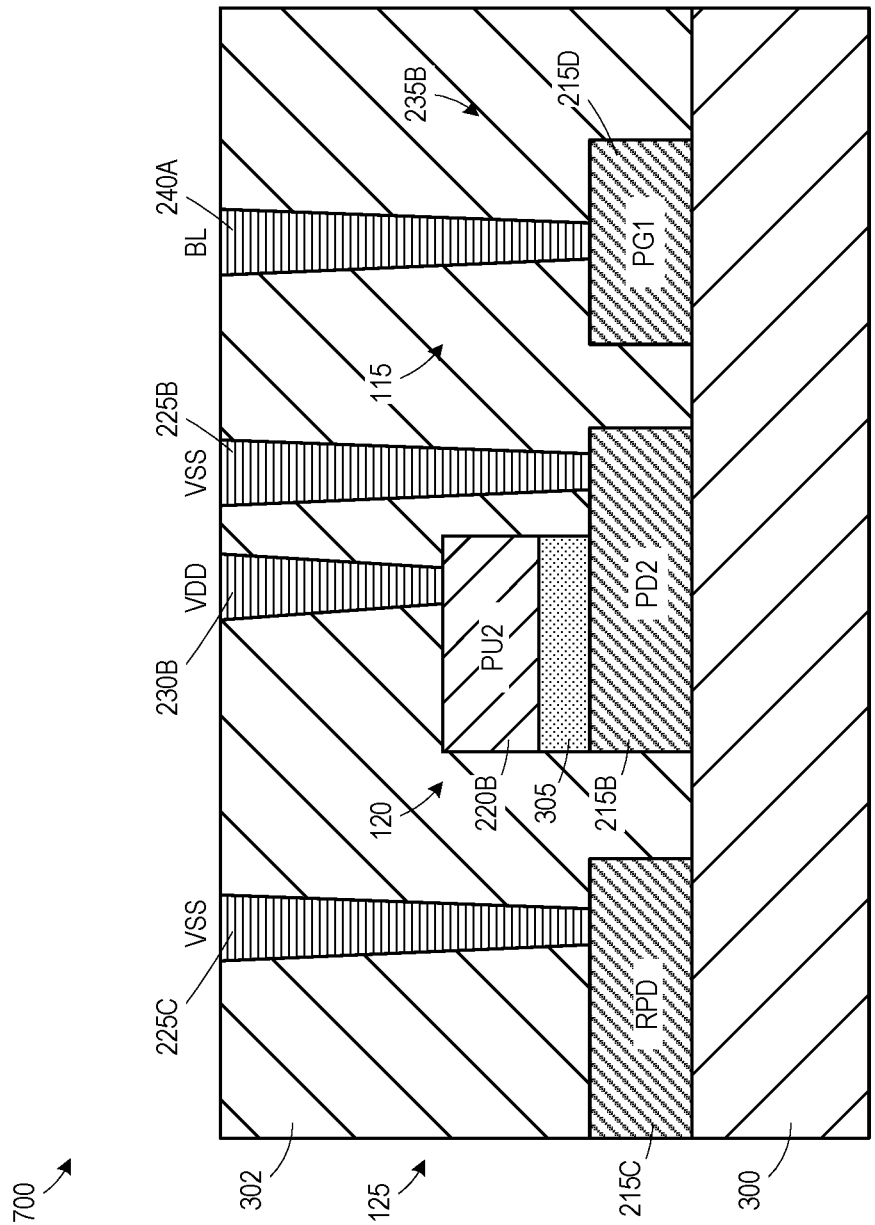
FIG. 8 is a cross-sectional view of an alternative embodiment of the two port SRAM constructed using complementary nano-sheet transistor devices.

FIG. 8 is a cross-sectional view of the product 700 through line "3-3" in FIG. 2 illustrating the process flow applied to both the stacked CFET nano-sheet devices 115, 120 in the regions 223A, 235B and the stacked NFET nano-sheet device 125. Note that the RPD S/D region 215C has the same thickness as the S/D regions 215B, 215D for PD2 and PG1.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

What is claimed:

1. A device comprising:
    a first stacked nano-sheet device having a first stack comprising a first P-type nano-sheet and a first N-type nano-sheet, a first pull-up transistor positioned in the first P-type nano-sheet, and a first pull-down transistor and a first pass gate transistor positioned in the first N-type nano-sheet;
    a second stacked nano-sheet device having a second stack comprising a second P-type nano-sheet and a second N-type nano-sheet, a second pull-up transistor positioned in the second P-type nano-sheet, and a second pull-down transistor and a second pass gate transistor positioned in the second N-type nano-sheet;
    a third stacked nano-sheet device having a third stack comprising at least a third N-type nano-sheet, a read pull-down transistor and a read pass gate transistor positioned in the third N-type nano-sheet;
    a first shared gate structure positioned adjacent the first pull-up transistor and the first pull-down transistor; and
    a second shared gate structure positioned adjacent the second pull-up transistor, the second pull-down transistor, and the read pull-down transistor.

2. The device of claim 1, further comprising:
    a first interconnect structure connecting the second shared gate structure to a source/drain region of the first pull-up transistor, a source/drain region of the first pull-down transistor, and a source/drain region of the first pass gate transistor to define a first storage node of a memory cell; and
    a second interconnect structure connecting the first shared gate structure to a source/drain region of the second pull-up transistor, a source/drain region of the second pull-down transistor, and a source/drain region of the second pass gate transistor to define a second storage node of the memory cell.

3. The device of claim 2, wherein the first interconnect structure at least partially overlaps the second interconnect structure when viewed from a top view.

4. The device of claim 1, wherein the third stack of the third stacked nano-sheet device comprises the third N-type nano-sheet and a fourth N-type nano-sheet, and source/drain regions of each of the read pull-down transistor and the read pass gate transistor contact the third and fourth N-type nano-sheets.

5. The device of claim 1, wherein the first P-type nano-sheet does not overlap the first N-type nano-sheet in a first region of the first stacked nano-sheet device including the first pass gate transistor, and the second P-type nano-sheet does not overlap the second N-type nano-sheet in a second region of the second stacked nano-sheet device including the second pass gate transistor.

6. The device of claim 1, wherein the source/drain region of the first pull-up transistor does not vertically overlap the source/drain region of the first pass gate transistor, and the source/drain region of the second pull-up transistor does not vertically overlap the source/drain region of the second pass gate transistor.

7. The device of claim 6, further comprising:
    a first bit line contact contacting the source/drain region of the first pass gate transistor;
    a second bit line contact contacting the source/drain region of the second pass gate transistor; and
    a third bit line contact contacting a source/drain region of the read pass gate transistor.

8. The device of claim 1, wherein a source/drain region lateral extension of the first pull-up transistor does not vertically overlap a source/drain region lateral extension of the first pull-down transistor, and a source/drain region lateral extension of the second pull-up transistor does not vertically overlap a source/drain region lateral extension of the second pull-down transistor.

9. The device of claim 8, further comprising:
    a first VDD contact contacting the source/drain region lateral extension of the first pull-up transistor;
    a first VSS contact contacting the source/drain region lateral extension of the first pull-down transistor;
    a second VDD contact contacting the source/drain region lateral extension of the second pull-up transistor; and
    a second VSS contact contacting the source/drain region lateral extension of the second pull-down transistor.

10. The device of claim 1, wherein a first width of the first stacked nano-sheet device is less than a second width of the third stacked nano-sheet device.

11. The device of claim 1, further comprising:
    a first buried VSS line positioned below a source/drain region lateral extension of the read pass gate transistor;
    a first VSS contact connecting the first buried VSS line to the source/drain region lateral extension of the read pass gate transistor;
    a second buried VSS line positioned below a source/drain region lateral extension of the first pull-down transistor and a source/drain region lateral extension of the second pull-down transistor;
    a second VSS contact connecting the second buried VSS line to the source/drain region lateral extension of the first pull-down transistor; and
    a third VSS contact connecting the second buried VSS line to the source/drain region lateral extension of the second pull-down transistor.

12. The device of claim 11, wherein a source/drain region lateral extension of the first pull-up transistor vertically overlaps the source/drain region lateral extension of the first pull-down transistor, a source/drain region lateral extension of the second pull-up transistor vertically overlaps the source/drain region lateral extension of the second pull-down transistor, and the device further comprises:
    a first VDD contact contacting the source/drain region lateral extension of the first pull-up transistor; and
    a second VDD contact contacting the source/drain region lateral extension of the first pull-up transistor.

13. The device of claim 12, wherein the first VDD contact vertically overlaps the first VSS contact when viewed from above, and the second VDD contact vertically overlaps the second VSS contact when viewed from a top view.

14. The device of claim 1, wherein a source/drain region of the read pass gate transistor and a source/drain region of the read pull-down transistor each have a first vertical thickness, and a source/drain region of the first pass gate transistor and a source/drain region of the second pass gate transistor each have a second vertical thickness less than the first vertical thickness.

15. The device of claim 1, wherein a source/drain region of the read pass gate transistor and a source/drain region of the read pull-down transistor each have a first vertical thickness, and a source/drain region of the first pass gate transistor and a source/drain region of the second pass gate transistor each have a second vertical thickness substantially equal to the first vertical thickness.

16. A method, comprising:
forming a first stacked nano-sheet device having a first stack comprising a first P-type nano-sheet and a first N-type nano-sheet;
forming a first pull-up transistor in the first P-type nano-sheet;
forming a first pull-down transistor and a first pass gate transistor in the first N-type nano-sheet;
forming a second stacked nano-sheet device having a second stack comprising a second P-type nano-sheet and a second N-type nano-sheet;
forming a second pull-up transistor in the second P-type nano-sheet;
forming a second pull-down transistor and a second pass gate transistor in the second N-type nano-sheet;
forming a third stacked nano-sheet device having a third stack comprising at least a third N-type nano-sheet;
forming a read pull-down transistor and a read pass gate transistor in the third N-type nano-sheet;
forming a first shared gate structure adjacent the first pull-up transistor and the first pull-down transistor; and
forming a second shared gate structure adjacent the second pull-up transistor, the second pull-down transistor, and the read pull-down transistor.

17. The method of claim 16, further comprising:
forming a first interconnect structure connecting the second shared gate structure to a first source/drain region of the first pull-up transistor, a second source/drain region of the first pull-down transistor, and a third source/drain region of the first pass gate transistor to define a first storage node of a memory cell; and
forming a second interconnect structure connecting the first shared gate structure to a fourth source/drain region of the second pull-up transistor, a fifth source/drain region of the second pull-down transistor, and a sixth source/drain region of the second pass gate transistor to define a second storage node of the memory cell.

18. The method of claim 16, further comprising:
removing a first portion of the first P-type nano-sheet in a region of the first stacked nano-sheet device corresponding to the first pass gate transistor; and
removing a second portion of the second P-type nano-sheet in a region of the second stacked nano-sheet device corresponding to the second pass gate transistor.

19. The method of claim 16, wherein the third stack of the third stacked nano-sheet device comprises the third N-type nano-sheet and a fourth N-type nano-sheet, and the method further comprises forming source/drain regions of each of the read pull-down transistor and the read pass gate transistor that contact the third and fourth N-type nano-sheets.

20. The method of claim 16, wherein the third stack of the third stacked nano-sheet device comprises the third N-type nano-sheet and a fourth N-type nano-sheet, and the method further comprises removing at least a portion of the fourth N-type nano-sheet.

\* \* \* \* \*